(12) United States Patent
Fujino

(10) Patent No.: US 12,356,694 B2
(45) Date of Patent: Jul. 8, 2025

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Yuhki Fujino, Kanazawa Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 522 days.

(21) Appl. No.: 17/870,045

(22) Filed: Jul. 21, 2022

(65) Prior Publication Data

US 2023/0307510 A1    Sep. 28, 2023

(30) Foreign Application Priority Data

Mar. 23, 2022  (JP) ................. 2022-046796

(51) Int. Cl.
   *H10D 64/00* (2025.01)
   *H10D 30/01* (2025.01)
   (Continued)

(52) U.S. Cl.
   CPC ....... *H10D 64/117* (2025.01); *H10D 30/0291* (2025.01); *H10D 30/66* (2025.01); *H10D 62/393* (2025.01); *H10D 64/01* (2025.01)

(58) Field of Classification Search
   CPC ............. H01L 29/1095; H01L 29/0696; H01L 29/66712; H01L 29/7802; H01L 29/7813;
   (Continued)

(56) References Cited

U.S. PATENT DOCUMENTS 6,750,508 B2   6/2004  Omura et al.
8,546,847 B2 * 10/2013  Watanabe ............ H10D 12/481
                                                    257/133
(Continued)

FOREIGN PATENT DOCUMENTS

JP    2002-083963 A    3/2002
JP    2002-368215 A   12/2002
(Continued)

OTHER PUBLICATIONS

Office Action issued in Japanese Patent Application No. 2022-046796 dated Mar. 13, 2025, in 6 pages.

*Primary Examiner* — Jaehwan Oh
(74) *Attorney, Agent, or Firm* — Knobbe, Martens, Olson & Bear, LLP

(57) ABSTRACT

According to one embodiment, a semiconductor device includes first and second electrodes, first to third semiconductor regions a plurality of conductive parts, and a gate electrode. The first semiconductor region is located on the first electrode and electrically connected with the first electrode. The conductive parts are located in the first semiconductor region with insulating parts interposed. The second semiconductor region is located on a portion of the first semiconductor region. The third semiconductor region is located on a portion of the second semiconductor region. The gate electrode is located on the second semiconductor region with a gate insulating layer interposed. The second electrode is located on the second and third semiconductor regions, and the gate electrode and electrically connected with the second and third semiconductor regions, and conductive parts.

8 Claims, 21 Drawing Sheets

(51) Int. Cl.
*H10D 30/66* (2025.01)
*H10D 62/17* (2025.01)
*H10D 64/01* (2025.01)

(58) Field of Classification Search
CPC .. H01L 29/407; H10D 30/0291; H10D 30/66; H10D 62/393; H10D 64/117; H10D 62/127; H10D 30/668
See application file for complete search history.

(56) References Cited

U.S. PATENT DOCUMENTS

| | | | | |
|---|---|---|---|---|
| 9,543,396 | B2* | 1/2017 | Georgescu | H10D 30/63 |
| 2002/0030237 | A1* | 3/2002 | Omura | H10D 64/252 |
| | | | | 257/E21.345 |
| 2003/0042549 | A1 | 3/2003 | Fujihira et al. | |
| 2007/0045727 | A1* | 3/2007 | Shiraishi | H10D 64/661 |
| | | | | 257/E29.066 |
| 2012/0074461 | A1* | 3/2012 | Ono | H10D 62/111 |
| | | | | 257/E29.198 |
| 2014/0027841 | A1* | 1/2014 | Bhalla | H10D 62/393 |
| | | | | 257/330 |
| 2016/0163804 | A1* | 6/2016 | Kocon | H10D 64/256 |
| | | | | 257/329 |
| 2016/0329413 | A1* | 11/2016 | Jin | H10D 62/153 |
| 2017/0040423 | A1* | 2/2017 | Inoue | H10D 64/117 |
| 2018/0083128 | A1* | 3/2018 | Yokoyama | H10D 62/111 |
| 2018/0301538 | A1* | 10/2018 | Ogura | H10D 12/411 |
| 2019/0252541 | A1* | 8/2019 | Shimomura | H10D 62/105 |
| 2021/0296490 | A1* | 9/2021 | Shiraishi | H10D 30/0297 |
| 2023/0087505 | A1* | 3/2023 | Nishiwaki | H10D 64/518 |
| | | | | 257/329 |

FOREIGN PATENT DOCUMENTS

| | | |
|---|---|---|
| JP | 2007-059636 A | 3/2007 |
| JP | 5452195 B2 | 3/2014 |
| JP | 2015-115611 A | 6/2015 |
| JP | 2018-133579 A | 8/2018 |
| JP | 6626541 B2 | 12/2019 |
| JP | 2023-040756 A | 3/2023 |

* cited by examiner

ABSTRACT# SEMICONDUCTOR DEVICE

CROSS-REFERENCE TO RELATED APPLICATIONS

This application is based upon and claims the benefit of priority from Japanese Patent Application No. 2022-046796, filed on Mar. 23, 2022; the entire contents of which are incorporated herein by reference.

FIELD

Embodiments described herein relate generally to a semiconductor device.

BACKGROUND

Semiconductor devices such as metal oxide semiconductor field effect transistors (MOSFETs) and the like are used in power conversion and the like. It is desirable for the on-resistance of semiconductor devices to be low.

DETAILED DESCRIPTION

Figure 1:
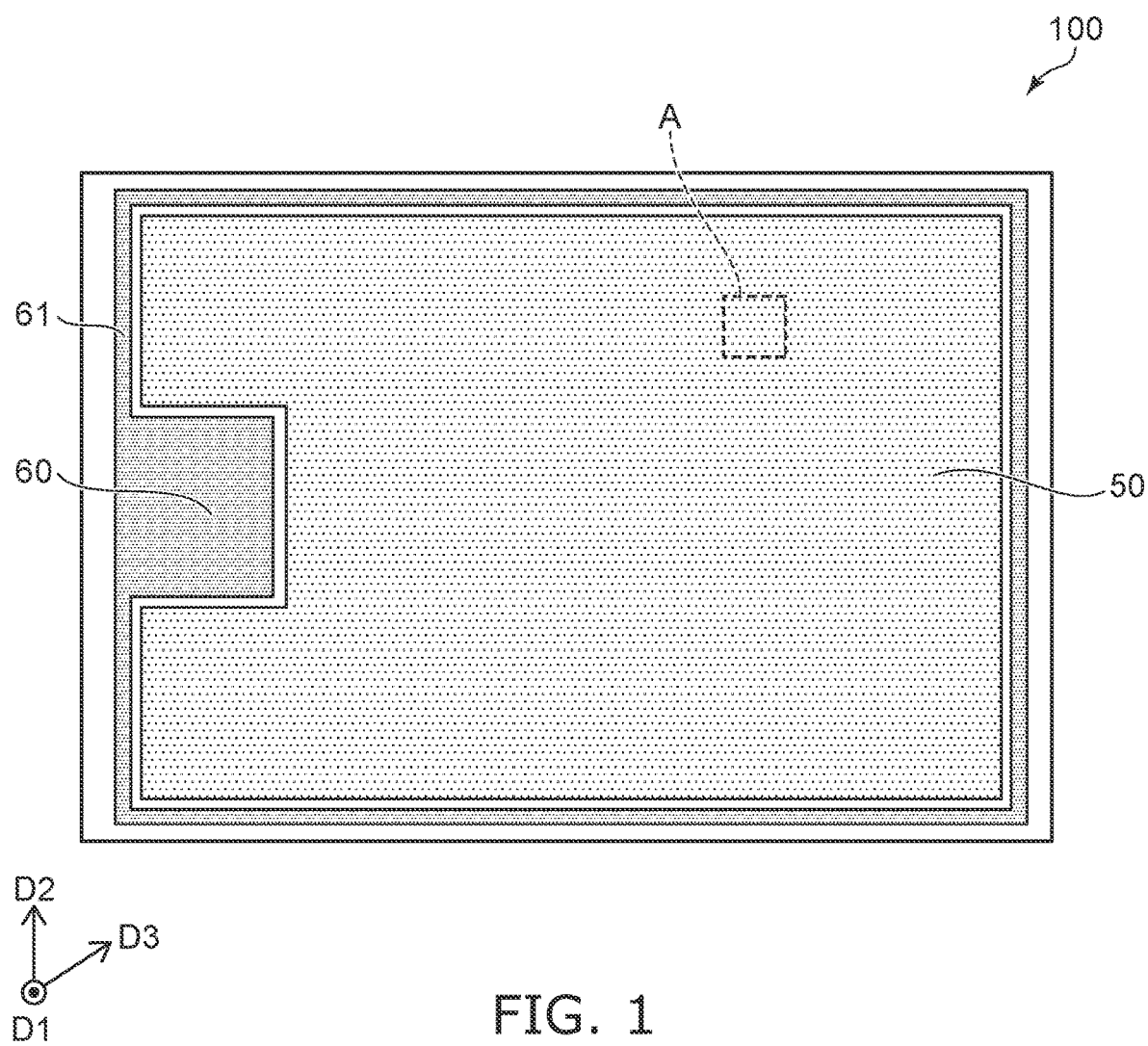
FIG. 1 is a plan view showing a semiconductor device according to an embodiment.

According to one embodiment, a semiconductor device includes a first electrode, a first semiconductor region of a first conductivity type, a plurality of conductive parts, a second semiconductor region of a second conductivity type, a third semiconductor region of the first conductivity type, a gate electrode, and a second electrode. The first semiconductor region is located on the first electrode and electrically connected with the first electrode. The conductive parts are located in the first semiconductor region with insulating parts interposed. The conductive parts are arranged in a second direction and a third direction. The second direction is perpendicular to a first direction. The first direction is from the first electrode toward the first semiconductor region. The third direction is perpendicular to the first direction and crosses the second direction. The second semiconductor region is located on a portion of the first semiconductor region. The third semiconductor region is located on a portion of the second semiconductor region. The gate electrode is located on the second semiconductor region with a gate insulating layer interposed. The second electrode is located on the second semiconductor region, the third semiconductor region, and the gate electrode and electrically connected with the second semiconductor region, the third semiconductor region, and the plurality of conductive parts.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the following description and drawings, the notations of $n^+$, $n^-$, $p^+$, and p indicate relative levels of the impurity concentrations. In other words, a notation marked with "+" indicates that the impurity concentration is relatively greater than that of a notation not marked with either "+" or "−"; and a notation marked with "−" indicates that the impurity concentration is relatively less than that of a notation without any mark. When both a p-type impurity and an n-type impurity are included in each region, these notations indicate relative levels of the net impurity concentrations after the impurities are compensated.

In embodiments described below, each embodiment may be implemented by inverting the p-type and the n-type of the semiconductor regions.

Figure 2:
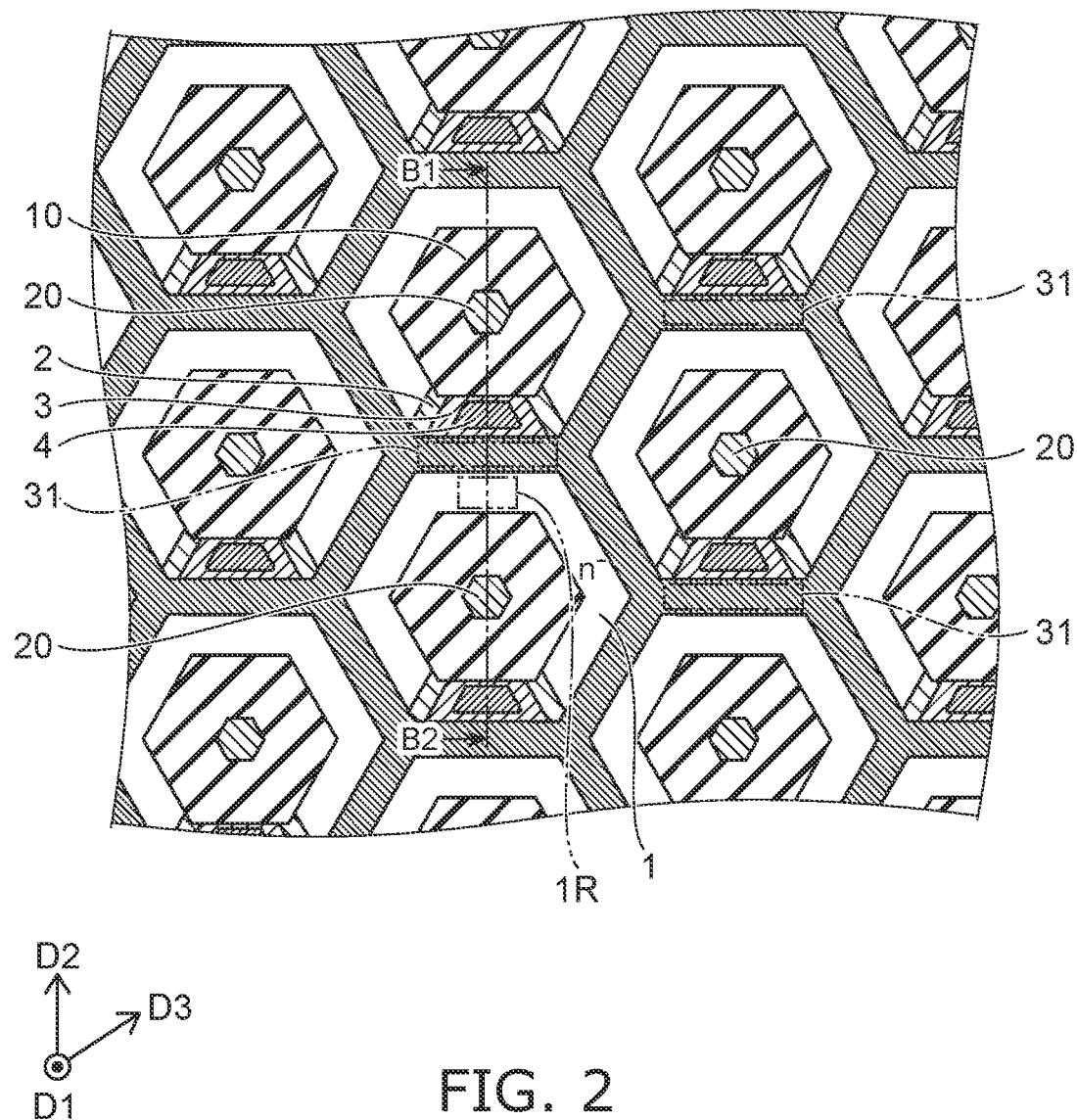
FIG. 2 is an enlarged plan view of portion A of FIG. 1.
Figure 3:
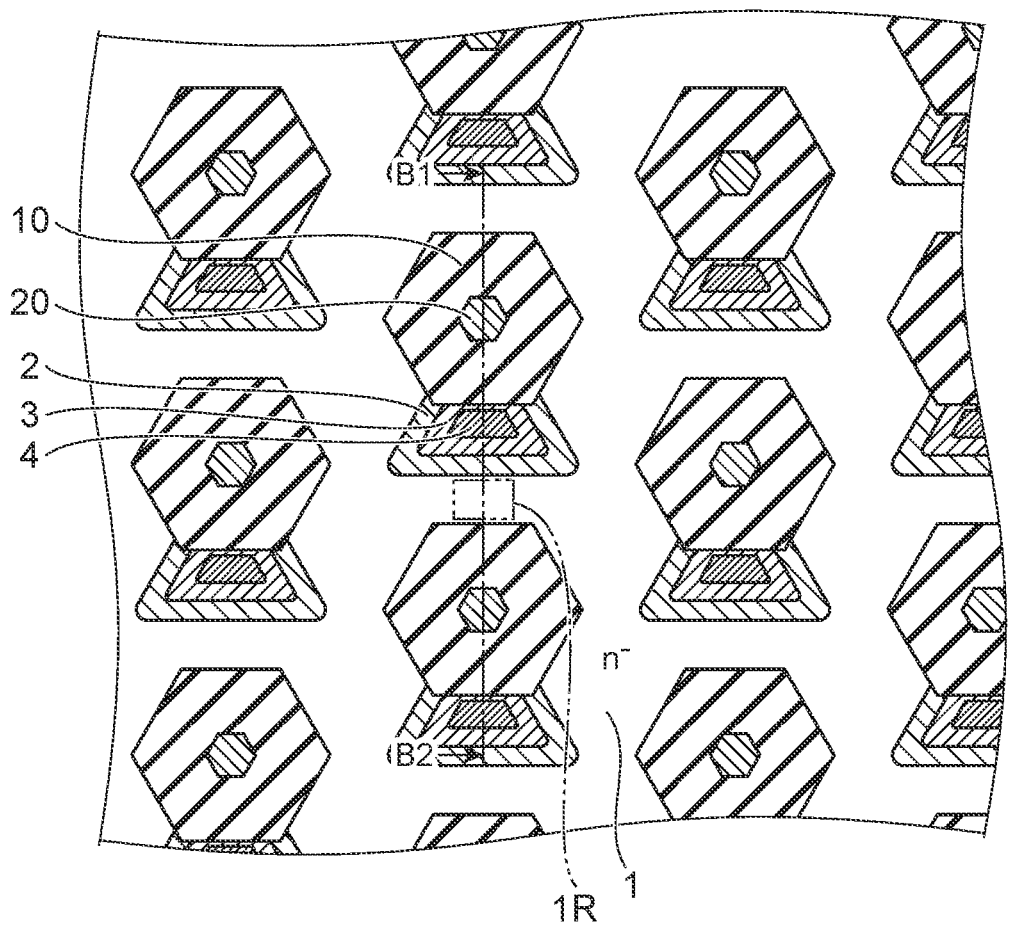
FIG. 3 is an enlarged plan view of portion A of FIG. 1.
Figure 3:
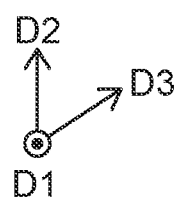
Figure 4:
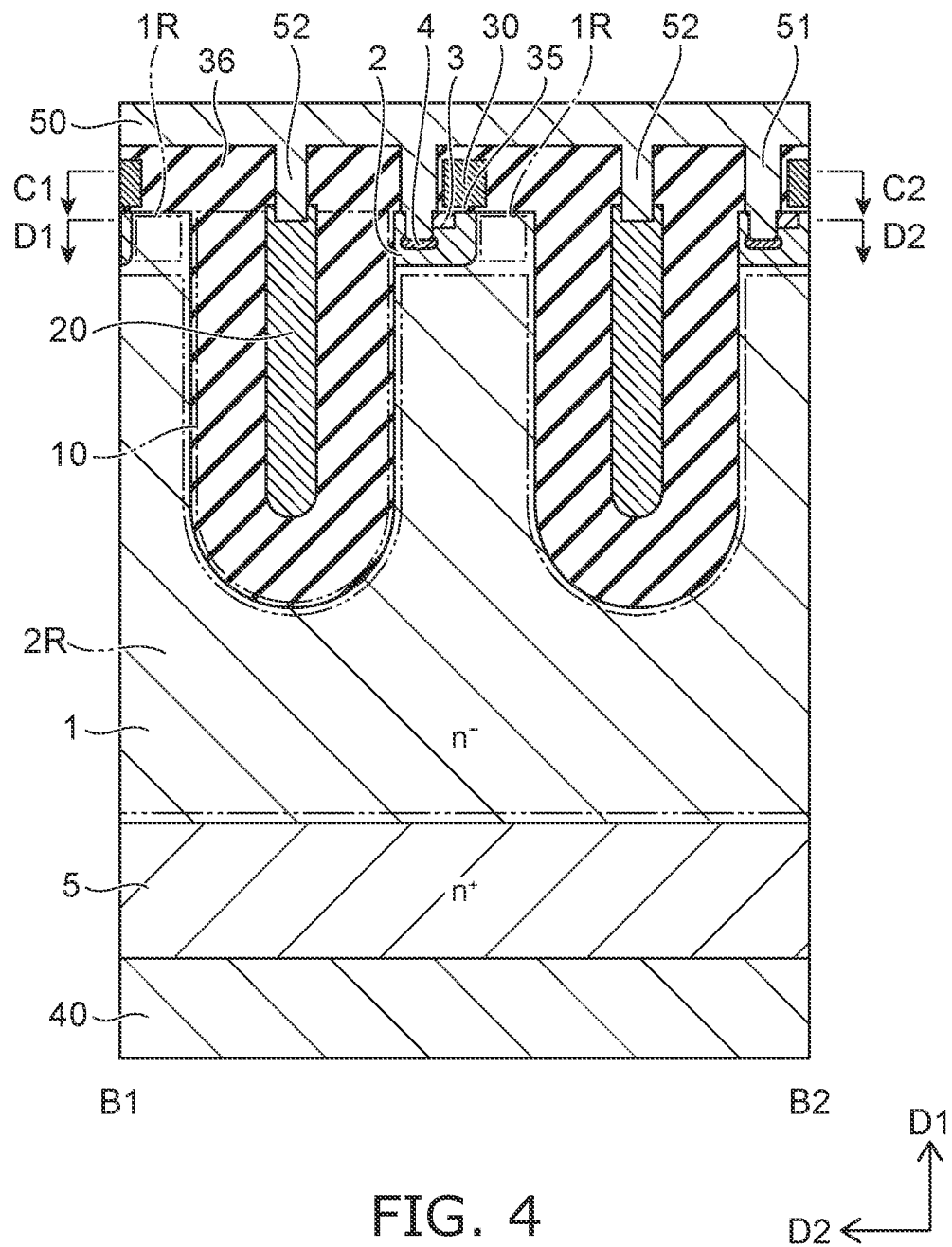
FIG. 4 is a B1-B2 cross-sectional view of FIGS. 2 and 3.

FIG. 1 is a plan view showing a semiconductor device according to an embodiment. FIGS. 2 and 3 are enlarged plan views of portion A of FIG. 1. FIG. 4 is a B1-B2 cross-sectional view of FIGS. 2 and 3. FIG. 2 corresponds to a C1-C2 cross-sectional view of FIG. 4. FIG. 3 corresponds to a D1-D2 cross-sectional view of FIG. 4.

The semiconductor device according to the embodiment is a MOSFET. As shown in FIGS. 1 to 4, the semiconductor device 100 according to the embodiment includes an n⁻-type (first-conductivity-type) drift region 1 (a first semiconductor region), a p-type (second-conductivity-type) base region 2 (a second semiconductor region), an n⁺-type source region 3 (a third semiconductor region), a p⁺-type contact region 4, an n⁺-type drain region 5, an insulating part 10, a conductive part 20, a gate electrode 30, a gate insulating layer 35, an insulating layer 36, a drain electrode 40 (a first electrode), a source electrode 50 (a second electrode), a gate pad 60, and gate wiring 61. The insulating layer 36 and the source electrode 50 are not illustrated in FIGS. 2 and 3. Also, the gate electrode 30 is not illustrated in FIG. 3.

In the description of the embodiments, the direction from the drain electrode 40 toward the n⁻-type drift region 1 is taken as a "direction D1" (a first direction). One direction orthogonal to the direction D1 is taken as a "direction D2" (a second direction). A direction that is orthogonal to the direction D1 and crosses the direction D2 is taken as a "direction D3" (a third direction). Herein, the direction from the drain electrode 40 toward the n⁻-type drift region 1 is called "up", and the opposite direction is called "down". These directions are based on the relative positional relationship between the drain electrode 40 and the n⁻-type drift region 1 and are independent of the direction of gravity.

As shown in FIG. 1, the source electrode 50, the gate pad 60, and the gate wiring 61 are located at the upper surface of the semiconductor device 100. The gate pad 60 and the gate wiring 61 are separated from the source electrode 50 and electrically isolated from the source electrode 50. The gate wiring 61 is located around the source electrode 50 in a plane (a first plane) perpendicular to the direction D1. The gate wiring 61 is electrically connected with the gate pad 60.

As shown in FIG. 4, the drain electrode 40 is located at the lower surface of the semiconductor device 100. The n⁺-type drain region 5 is located on the drain electrode 40 and electrically connected with the drain electrode 40. The n⁻-type drift region 1 is located on the n⁺-type drain region 5. The n-type impurity concentration of the n⁻-type drift region 1 is less than the n-type impurity concentration of the n⁺-type drain region 5. The n⁻-type drift region 1 is electrically connected with the drain electrode 40 via the n⁺-type drain region 5.

The conductive part 20 is located in the n⁻-type drift region 1 with the insulating part 10 interposed. As shown in FIGS. 2 to 4, multiple conductive parts 20 are arranged in the directions D2 and D3. The multiple insulating parts 10 are separated from each other in the directions D2 and D3. The p-type base region 2 is located on a portion of the n⁻-type drift region 1 and positioned between the conductive parts 20. The n⁺-type source region 3 and the p⁺-type contact region 4 are located on portions of the p-type base region 2. The p-type impurity concentration of the p⁺-type contact region 4 is greater than the p-type impurity concentration of the p-type base region 2.

The gate electrode 30 is located on the p-type base region 2 with the gate insulating layer 35 interposed. The gate electrode 30 is electrically connected with the gate wiring 61.

More specifically as shown in FIGS. 3 and 4, the n⁻-type drift region 1 includes a first region 1R arranged with the p-type base region 2 in the direction D2, and a second region 2R positioned lower than the p-type base region 2. In the illustrated example, the gate electrode 30 is positioned on a portion of the first region 1R, a portion of the p-type base region 2, and a portion of the n⁺-type source region 3. For example, the n-type impurity concentration of the first region 1R is greater than the n-type impurity concentration of the second region 2R.

As shown in FIG. 2, the gate electrode 30 includes a first electrode portion 31. The multiple conductive parts 20 include a pair of conductive parts 20 that are next to each other in the direction D2. The position in the direction D2 of the first electrode portion 31 is between the position in the direction D2 of one of the pair of conductive parts 20 and the position in the direction D2 of the other of the pair of conductive parts 20. The first electrode portion 31 extends in an extension direction crossing the direction D2 that connects the pair of conductive parts 20. In other words, the length of the first electrode portion 31 in the extension direction is greater than the length of the first electrode portion 31 in the direction D2.

As shown in FIG. 4, the source electrode 50 is located on the n⁺-type source region 3, the p⁺-type contact region 4, and the gate electrode 30 and electrically connected with the n⁺-type source region 3, the p⁺-type contact region 4, and the conductive part 20. The p-type base region 2 is electrically connected with the source electrode 50 via the p⁺-type contact region 4. The gate electrode 30 is electrically isolated from the source electrode 50 by the insulating layer 36.

In the illustrated example, the source electrode 50 includes a first extension portion 51 and a second extension portion 52. The first extension portion 51 extends through the insulating layer 36 and extends along the direction D1. The lower end of the first extension portion 51 contacts the n⁺-type source region 3 and the p⁺-type contact region 4. The second extension portion 52 extends through the insulating layer 36 and extends along the direction D1. The lower end of the second extension portion 52 contacts the conductive part 20. A portion of the first extension portion 51 and a portion of the second extension portion 52 are positioned between the gate electrodes 30 in the direction D2.

Figure 5A:
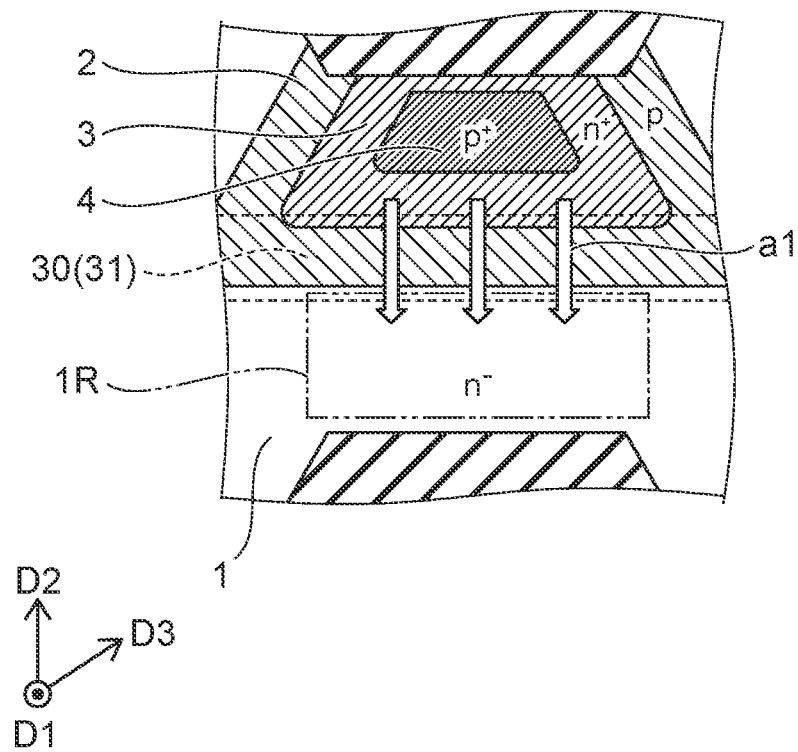
FIG. 5A is a plan view showing a portion of the semiconductor device according to the embodiment.
Figure 5B:
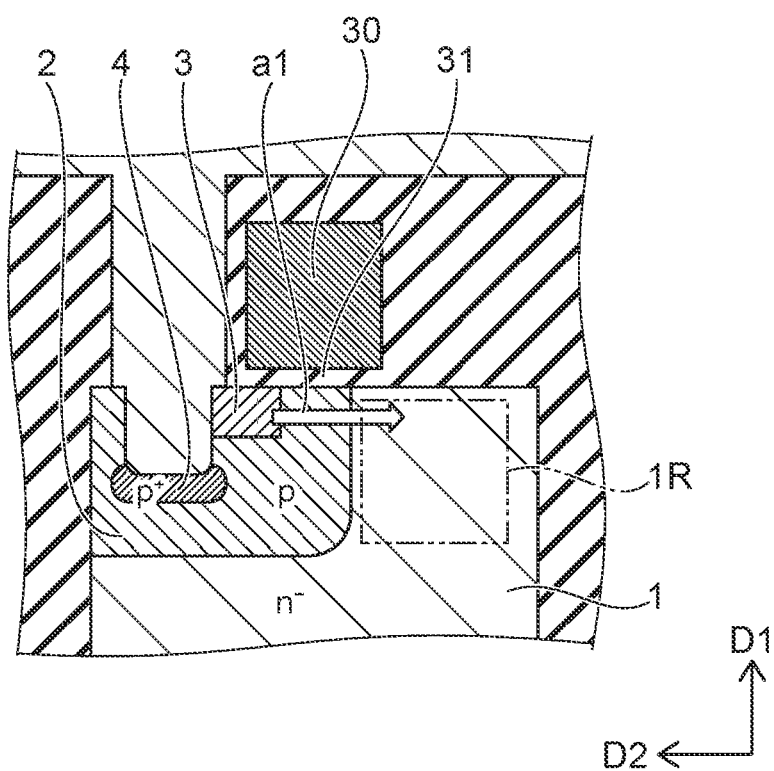
FIG. 5B is a cross-sectional view showing a portion of the semiconductor device according to the embodiment.

FIG. 5A is a plan view showing a portion of the semiconductor device according to the embodiment. FIG. 5B is a cross-sectional view showing a portion of the semiconductor device according to the embodiment.

Operations of the semiconductor device 100 will now be described with reference to FIGS. 5A and 5B. The gate electrode 30 is shown by a broken line in FIG. 5A.

A voltage that is not less than a threshold is applied to the gate electrode 30 in a state in which a positive voltage with respect to the source electrode 50 is applied to the drain electrode 40. Thereby, a channel (an inversion layer) is formed in the p-type base region 2; and the semiconductor device 100 is set to the on-state. As shown by arrows a1 in FIGS. 5A and 5B, electrons flow from the source electrode 50 toward the drain electrode 40 via the channel of the p-type base region 2. When the voltage that is applied to the gate electrode 30 drops below the threshold, the channel of the p-type base region 2 disappears, and the semiconductor device 100 switches to the off-state.

When the semiconductor device 100 switches to the off-state, the positive voltage that is applied to the drain electrode 40 increases with respect to the source electrode 50. The potential of the conductive part 20 is substantially equal to the potential of the source electrode 50. A depletion layer spreads toward the n⁻-type drift region 1 from the interface between the n⁻-type drift region 1 and the insulating part 10 due to the potential difference between the conductive part 20 and the n⁻-type drift region 1 that is electrically connected with the drain electrode 40. The breakdown voltage of the semiconductor device 100 can be increased by the spreading of the depletion layer. Or, the n-type impurity concentration in the n⁻-type drift region 1 can be increased and the on-resistance of the semiconductor device 100 can be reduced while maintaining the breakdown voltage of the semiconductor device 100.

Examples of the materials of the components of the semiconductor device 100 will now be described.

The n⁻-type drift region 1, the p-type base region 2, the n⁺-type source region 3, the p⁺-type contact region 4, and the n⁺-type drain region 5 include a semiconductor material. Silicon, silicon carbide, gallium nitride, or gallium arsenide can be used as the semiconductor material. Arsenic, phosphorus, or antimony can be used as the n-type impurity. Boron can be used as the p-type impurity.

The insulating part 10, the gate insulating layer 35, and the insulating layer 36 include insulating materials. For example, the insulating part 10, the gate insulating layer 35, and the insulating layer 36 include silicon oxide, silicon nitride, or silicon oxynitride. The conductive part 20 and the gate electrode 30 include polysilicon. An n-type or p-type impurity may be added to the conductive part 20 and the gate electrode 30. The drain electrode 40, the source electrode 50, the gate pad 60, and the gate wiring 61 include metals such as titanium, tungsten, aluminum, etc.

FIGS. 6A to 8B are cross-sectional views showing a method for manufacturing the semiconductor device according to the embodiment.

Figure 6A:
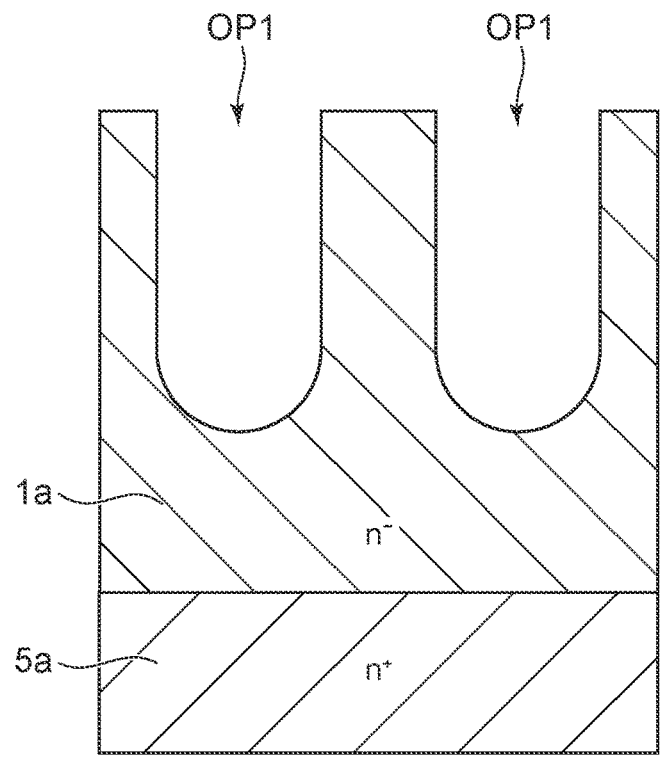
FIGS. 6A and 6B are cross-sectional views showing a method for manufacturing the semiconductor device according to the embodiment.

First, a semiconductor substrate that includes an n⁺-type semiconductor layer 5a is prepared. An n⁻-type semiconductor layer 1a is formed by epitaxially growing a semiconductor material on the n⁺-type semiconductor layer 5a. As shown in FIG. 6A, openings OP1 are formed in the n⁻-type semiconductor layer 1a by reactive ion etching (RIE). Multiple openings OP1 are formed in the directions D2 and D3.

Figure 6B:
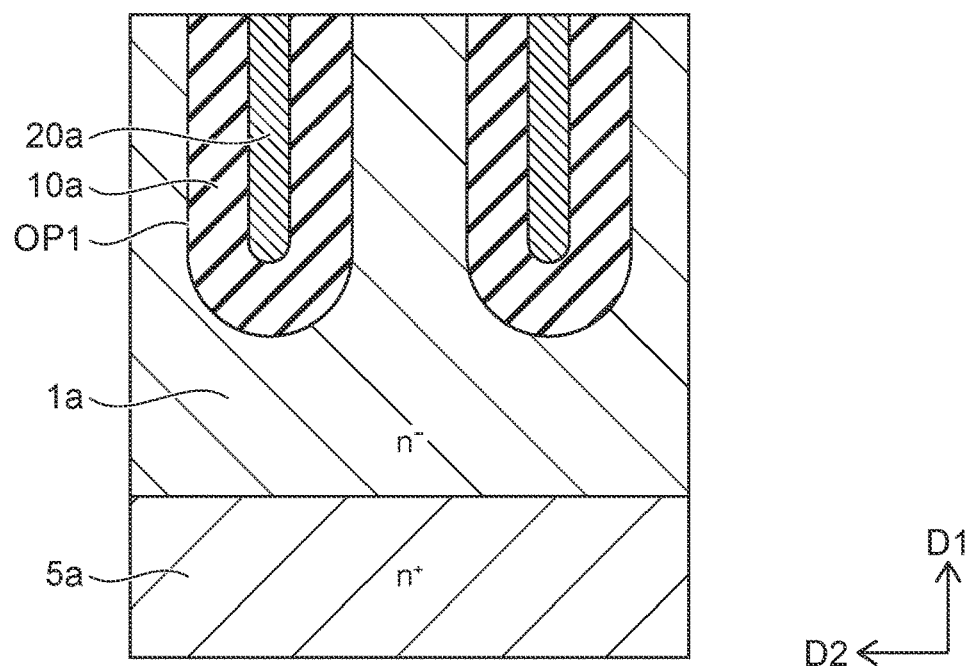

An insulating layer 10a is formed along the inner surfaces of the openings OP1 and the upper surface of the n⁻-type semiconductor layer 1a by thermal oxidation or chemical vapor deposition (CVD). A conductive layer is formed on the insulating layer 10a by CVD. The upper surface of the conductive layer is caused to recede by chemical dry etching (CDE) or wet etching. Thereby, a conductive layer 20a is formed inside the opening OP1. As shown in FIG. 6B, the upper surface of the insulating layer 10a is caused to recede by CDE or wet etching, and the upper surface of the n⁻-type semiconductor layer 1a is exposed.

Figure 7A:
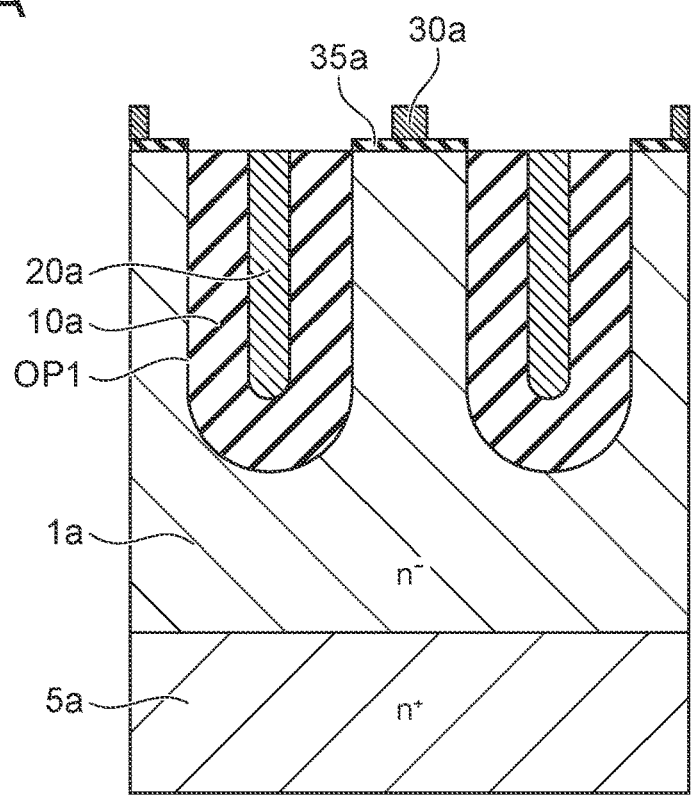
FIGS. 7A and 7B are cross-sectional views showing a method for manufacturing the semiconductor device according to the embodiment.

An insulating layer 35a is formed at the exposed upper surface of the n⁻-type semiconductor layer 1a by thermal oxidation. A conductive layer is formed on the insulating layer 35a by CVD. A conductive layer 30a is formed as shown in FIG. 7A by patterning the conductive layer by RIE.

Figure 7B:
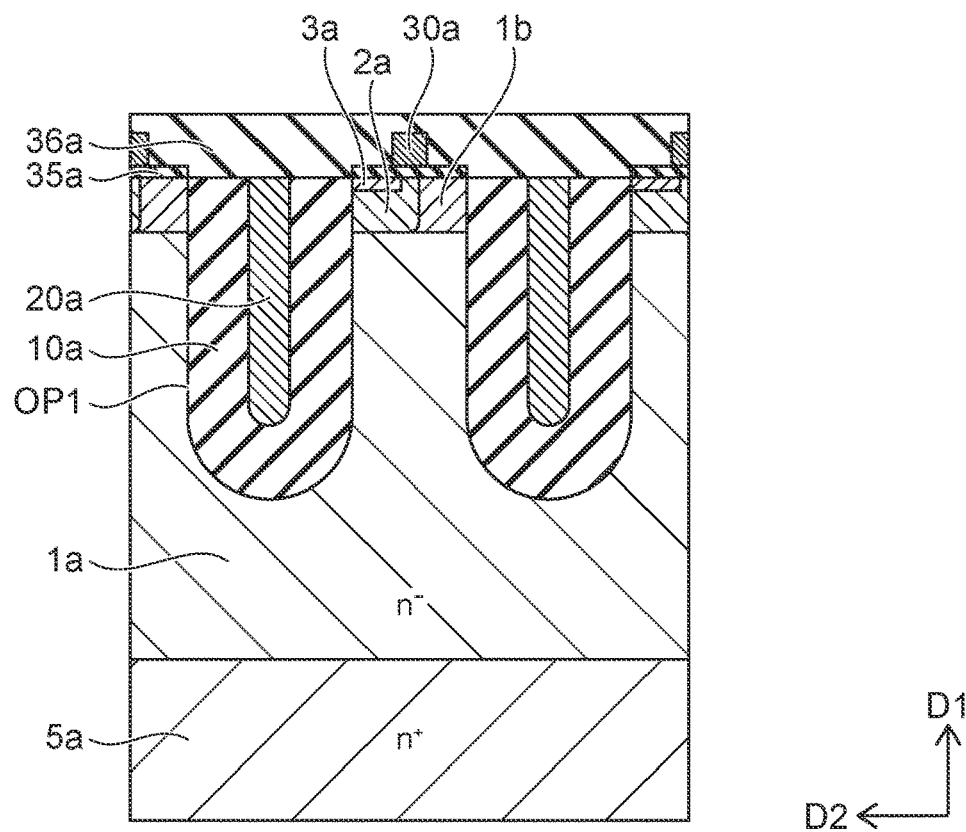

An n-type semiconductor region 1b, a p-type semiconductor region 2a, and an n⁺-type semiconductor region 3a are formed by sequentially ion-implanting a p-type impurity and an n-type impurity into the upper surface of the n⁻-type semiconductor layer 1a. As shown in FIG. 7B, an insulating layer 36a that covers the conductive layer 30a is formed by CVD.

Figure 8A:
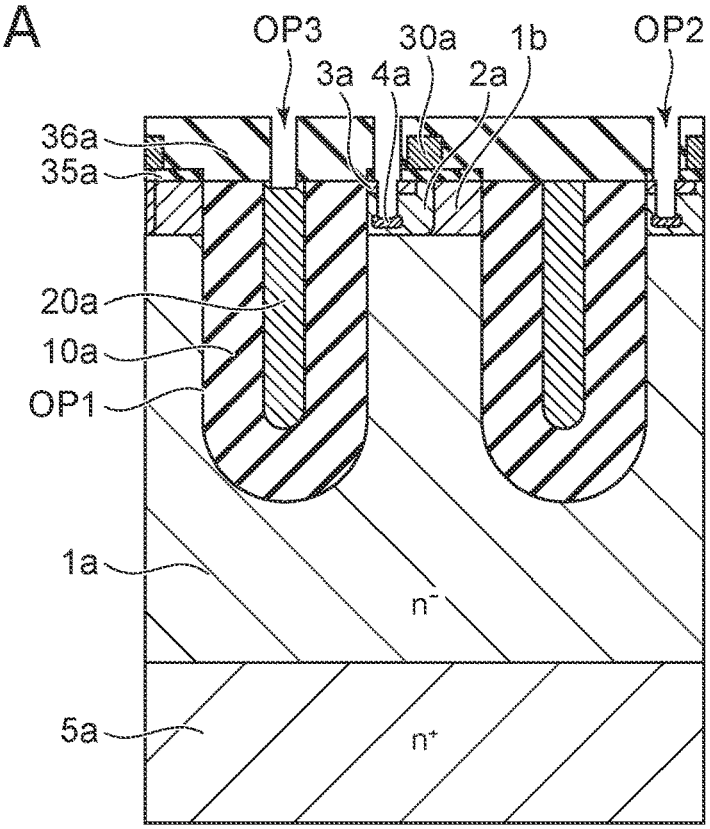
FIGS. 8A and 8B are cross-sectional views showing a method for manufacturing the semiconductor device according to the embodiment.

An opening OP2 is formed by removing a portion of the insulating layer 36a, a portion of the insulating layer 35a, a portion of the n⁺-type semiconductor region 3a, and a portion of the p-type semiconductor region 2a by RIE. The p-type semiconductor region 2a and the n⁺-type semiconductor region 3a are exposed via the opening OP2. A p⁺-type semiconductor region 4a is formed by ion-implanting a p-type impurity into the p-type semiconductor region 2a via the opening OP2. As shown in FIG. 8A, an opening OP3 is formed by removing another portion of the insulating layer 36a by RIE. The conductive layer 20a is exposed via the opening OP3.

Figure 8B:
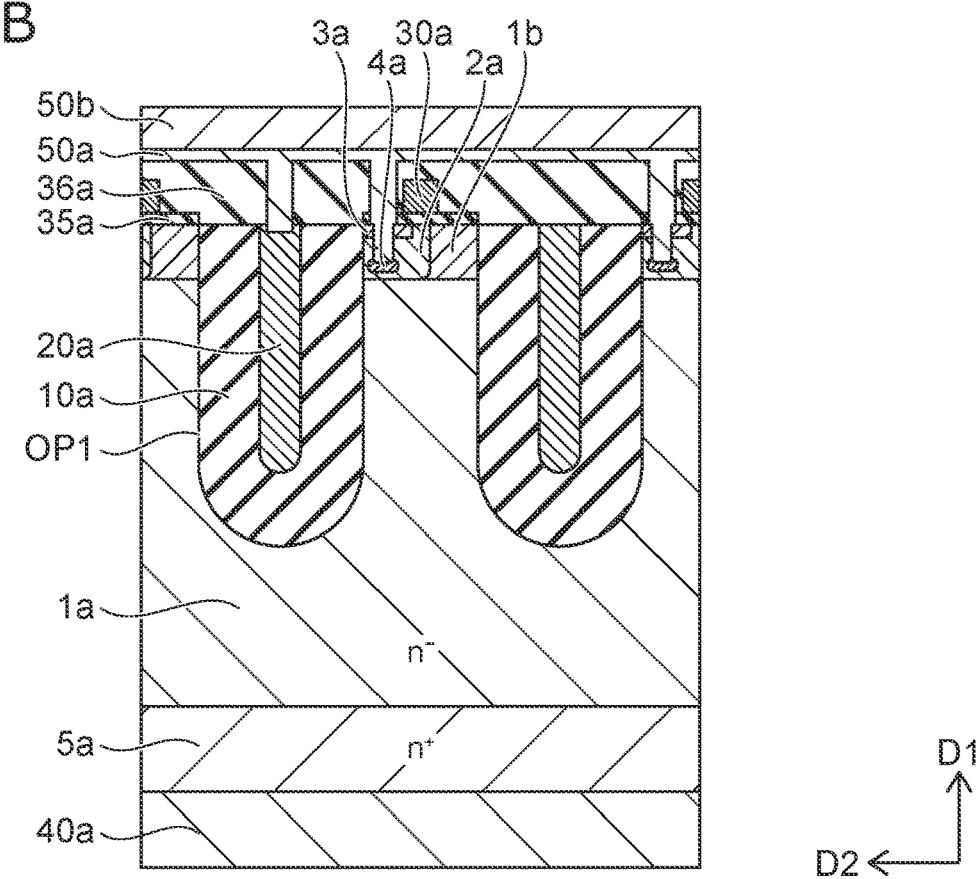

A barrier metal 50a that fills the openings OP2 and OP3 is formed by CVD. For example, the barrier metal 50a has a stacked structure of a titanium nitride layer, a titanium layer, and a tungsten layer. An aluminum layer 50b is formed on the barrier metal 50a by sputtering. The barrier metal 50a and the aluminum layer 50b are patterned. The lower surface of the n⁺-type semiconductor layer 5a is polished until the n⁺-type semiconductor layer 5a has a prescribed thickness. As shown in FIG. 8B, an aluminum layer 40a is formed at the lower surface of the n⁺-type semiconductor layer 5a by sputtering. Thus, the semiconductor device 100 is manufactured.

The n⁻-type semiconductor layer 1a shown in FIG. 8B corresponds to the second region 2R of the n⁻-type drift region 1 shown in FIGS. 1 to 4. The n-type semiconductor region 1b corresponds to the first region 1R of the n⁻-type drift region 1. The p-type semiconductor region 2a corresponds to the p-type base region 2. The n⁺-type semiconductor region 3a corresponds to the n⁺-type source region 3. The p⁺-type semiconductor region 4a corresponds to the p⁺-type contact region 4. The n⁺-type semiconductor layer 5a corresponds to the n⁺-type drain region 5. The insulating layer 10a corresponds to the insulating part 10. The conductive layer 20a corresponds to the conductive part 20. The conductive layer 30a corresponds to the gate electrode 30. The insulating layer 35a corresponds to the gate insulating layer 35. The insulating layer 36a corresponds to the insulating layer 36. The aluminum layer 40a corresponds to the drain electrode 40. The patterned barrier metal 50a and aluminum layer 50b correspond to the source electrode 50, the gate pad 60, and the gate wiring 61.

Figure 9:
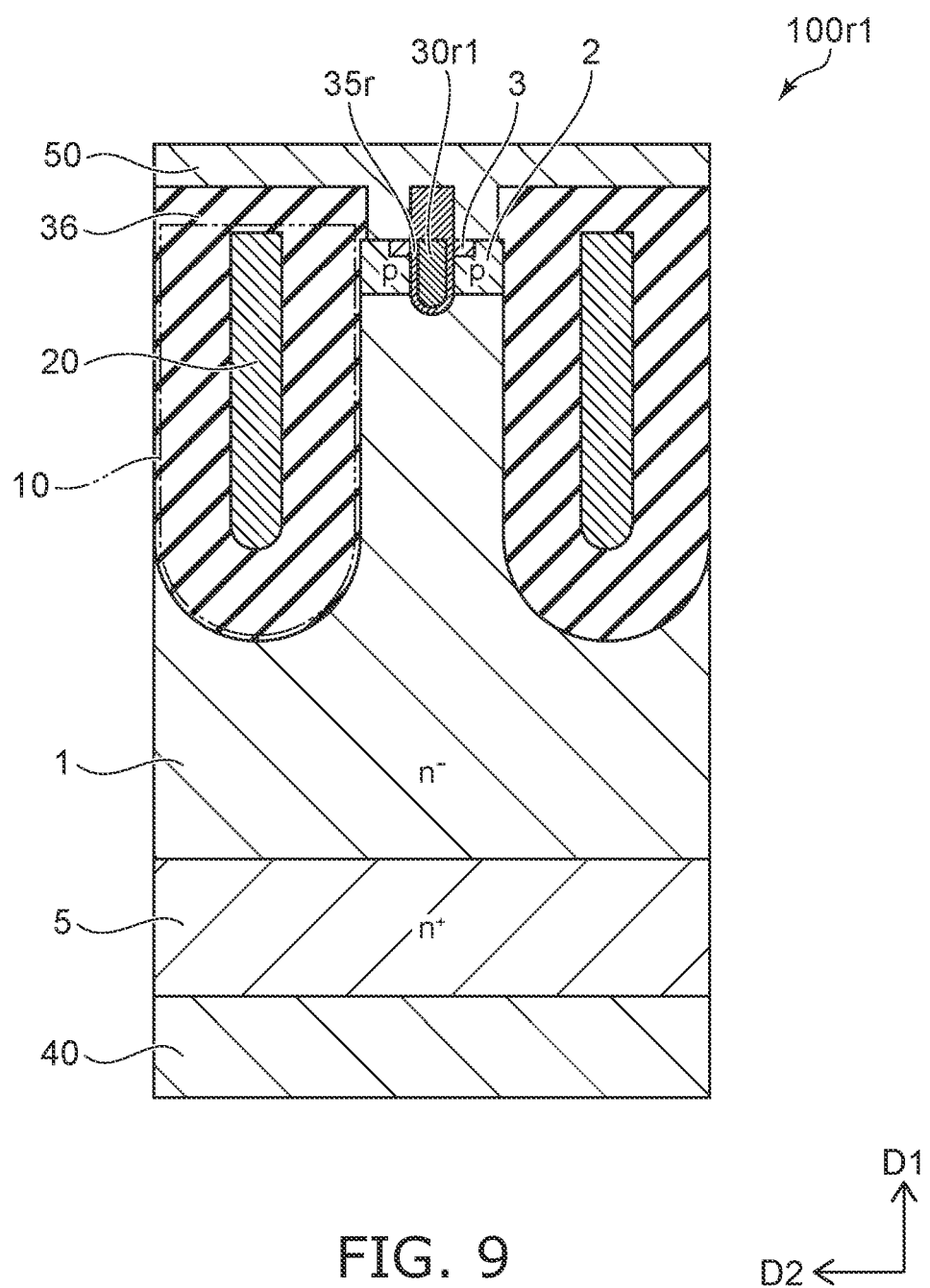
FIG. 9 is across-sectional view showing a portion of a semiconductor device according to a reference example.
Figure 10:
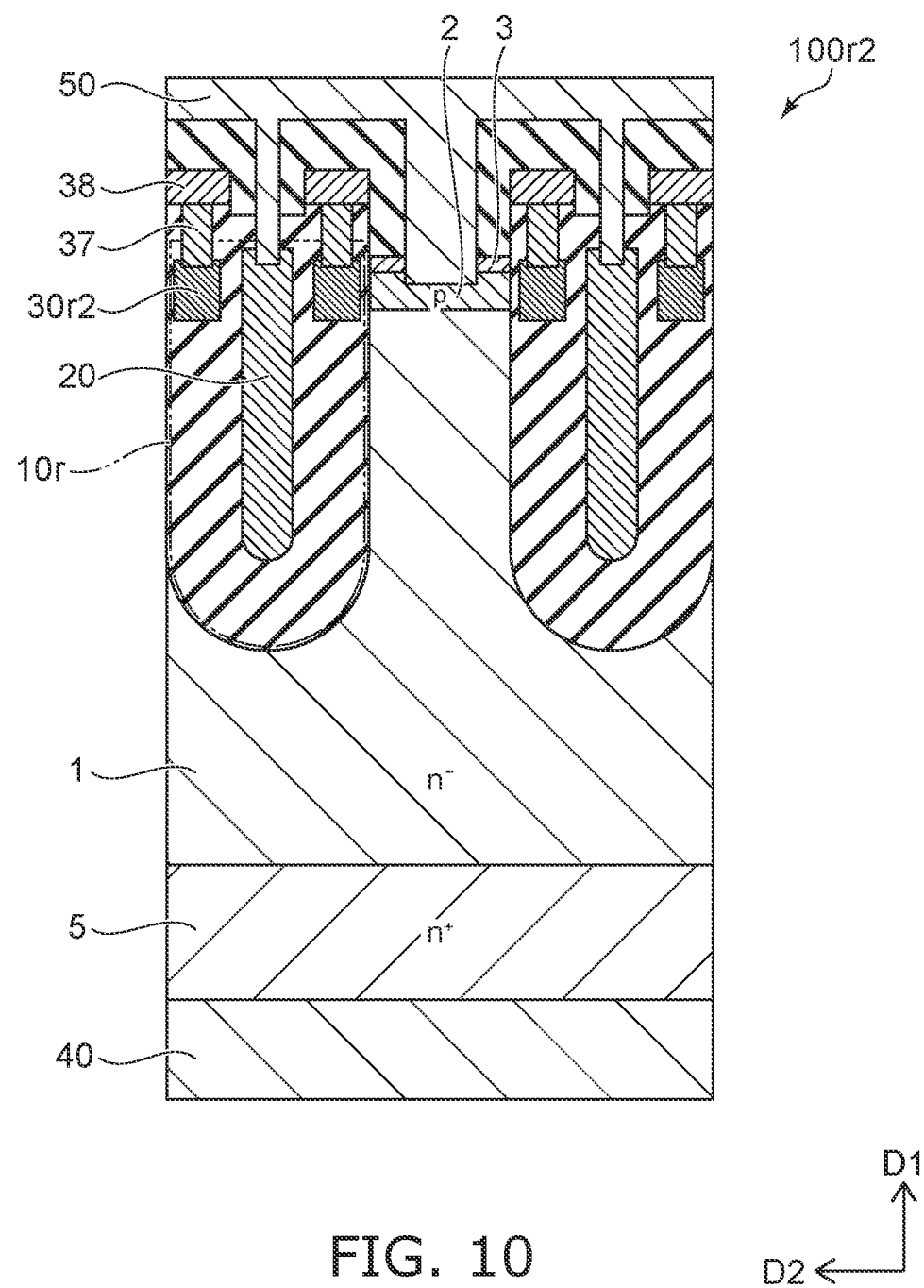
FIG. 10 is across-sectional view showing a portion of a semiconductor device according to a reference example.

FIGS. 9 and 10 are cross-sectional views showing portions of semiconductor devices according to reference examples.

In a semiconductor device 100r1 shown in FIG. 9, a gate electrode 30r1 is located in the semiconductor region with a gate insulating layer 35r interposed. The gate insulating layer 35r is separated from the insulating part 10. In a semiconductor device 100r2 shown in FIG. 10, a gate electrode 30r2 is located in an insulating part 10r. The gate electrode 30r2 is electrically connected with a gate wiring layer 38 via a contact portion 37. The gate wiring layer 38 is located along the first plane and positioned between the semiconductor region and the source electrode 50.

In each of the semiconductor devices 100r1 and 100r2, multiple conductive parts 20 are arranged in the directions D2 and D3. According to this structure, the volume of the n⁻-type drift region 1 is greater than when the conductive parts 20 extend in one direction. The current path in the on-state can be increased, and the on-resistance of the semiconductor devices 100r1 and 100r2 can be reduced.

On the other hand, in the semiconductor device 100r1, the surface area at which the n⁻-type drift region 1 and the gate electrode 30r1 face each other is large; and a capacitance Cgd between the drain electrode 40 and the gate electrode 30r1 is increased. In the semiconductor device 100r2, the gate electrode 30r2 is located in the insulating part 10r; and the surface area at which the n⁻-type drift region 1 and the gate electrode 30r2 face each other can be reduced compared to the semiconductor device 100r. However, the gate wiring layer 38 for electrically connecting the gate electrode 30r2 to the gate wiring 61, the contact portion 37 for connecting the gate electrode 30r2 and the gate wiring layer 38, etc., are necessary in the semiconductor device 100r2. Therefore, a margin for accommodating the position fluctuation of the contact portion 37 is necessary, and the number of processes necessary for manufacturing is increased. Also, a capacitance Cgs between the gate electrode 30r1 and the source electrode 50 is increased by the gate wiring layer 38 facing the source electrode 50 in the direction D1.

For these problems, in the semiconductor device 100 according to the embodiment, the multiple conductive parts 20 are included, and the gate electrode 30 is located on the p-type base region 2 with the gate insulating layer 35 interposed. By arranging the multiple conductive parts 20 in the directions D2 and D3, the on-resistance of the semiconductor device 100 can be reduced similarly to the semiconductor devices 100r1 and 100r2. Furthermore, by providing the gate electrode 30 on the p-type base region 2, compared to the semiconductor device 100r, the surface area at which the $n^-$-type drift region 1 and the gate electrode 30 face each other can be reduced, and the capacitance Cgd can be reduced. A wiring layer for connecting the gate electrode 30 and the gate wiring 61, etc., are unnecessary, and compared to the semiconductor device 100r2, the number of processes necessary for manufacturing can be reduced. Because the contact portion 37 is unnecessary, the conductive part 20, the gate electrode 30, etc., can be arranged with a higher density by the amount of the margin of the contact portion 37. Furthermore, by omitting the gate wiring layer 38, the capacitance Cgs can be less than that of the semiconductor device 100r2.

According to the embodiment, the on-resistance of the semiconductor device 100 can be reduced while suppressing the problems described above.

First Modification

Figure 11:
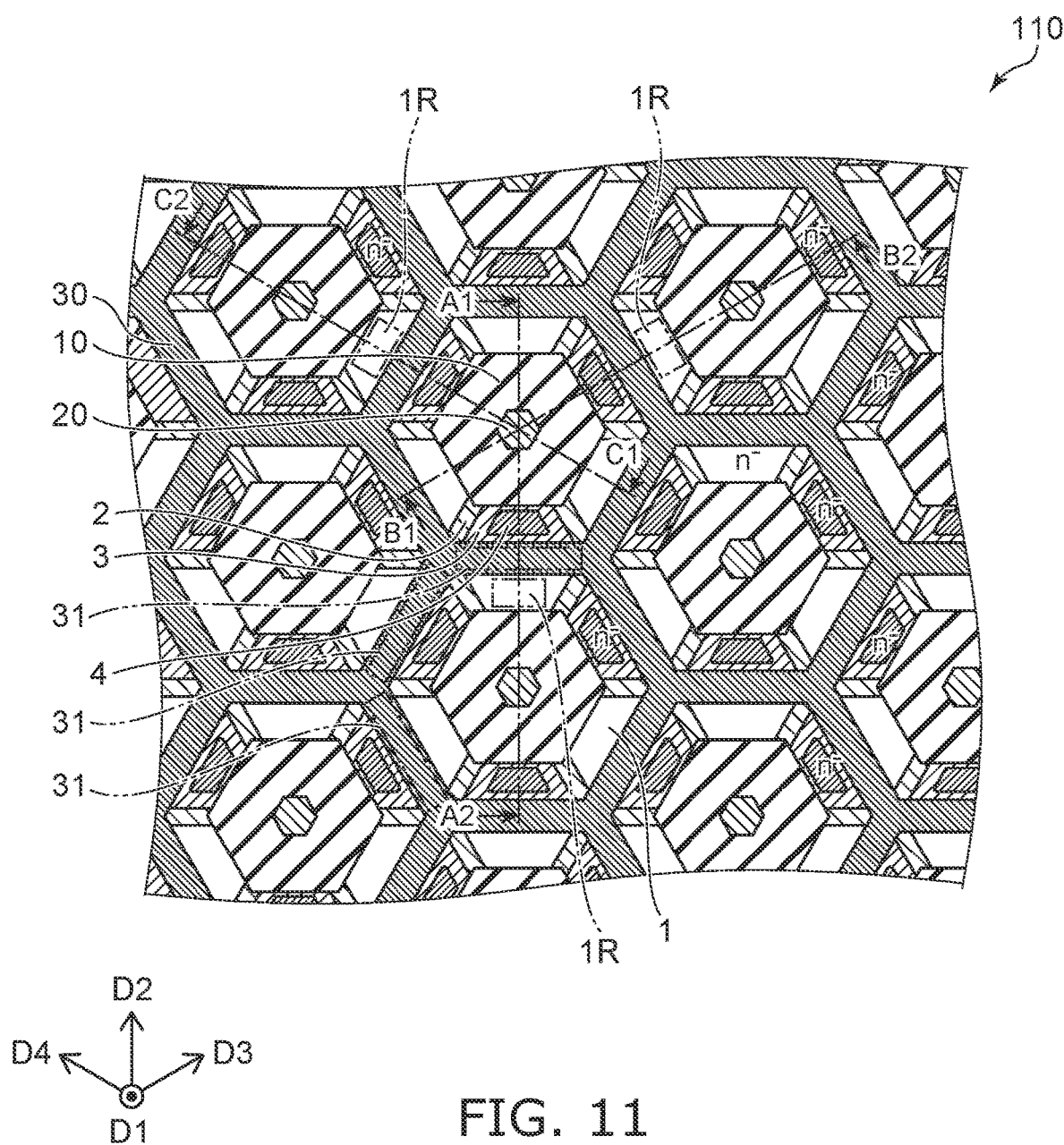
FIG. 11 is a plan view showing a portion of a semiconductor device according to a first modification of the embodiment.

FIG. 11 is a plan view showing a portion of a semiconductor device according to a first modification of the embodiment. The insulating layer 36 and the source electrode 50 are not illustrated in FIG. 11.

In the semiconductor device 110 according to the first modification as shown in FIG. 11, the multiple p-type base regions 2 and the multiple $n^+$-type source regions 3 are arranged around one conductive part 20 along the first plane. The p-type base region 2 and the first region 1R are alternately arranged around the one conductive part 20 along the first plane.

More specifically, the p-type base region 2, the $n^+$-type source region 3, and the first region 1R are positioned between the conductive parts 20 that are next to each other in the direction D2. Another p-type base region 2, another $n^+$-type source region 3, and another first region 1R are positioned between other conductive parts 20 that are next to each other in the direction D3. Still another p-type base region 2, still another $n^+$-type source region 3, and still another first region 1R are positioned between still other conductive parts 20 that are next to each other in a direction D4. The direction D4 is perpendicular to the direction D1 and crosses the directions D2 and D3. The first electrode portion 31 is located on each p-type base region 2 with the gate insulating layer 35 interposed.

The structures of the A1-A2 cross section, the B1-B2 cross section, and the C1-C2 cross section of FIG. 11 are similar to the cross-sectional structures shown in FIGS. 5A and 5B.

Figure 12:
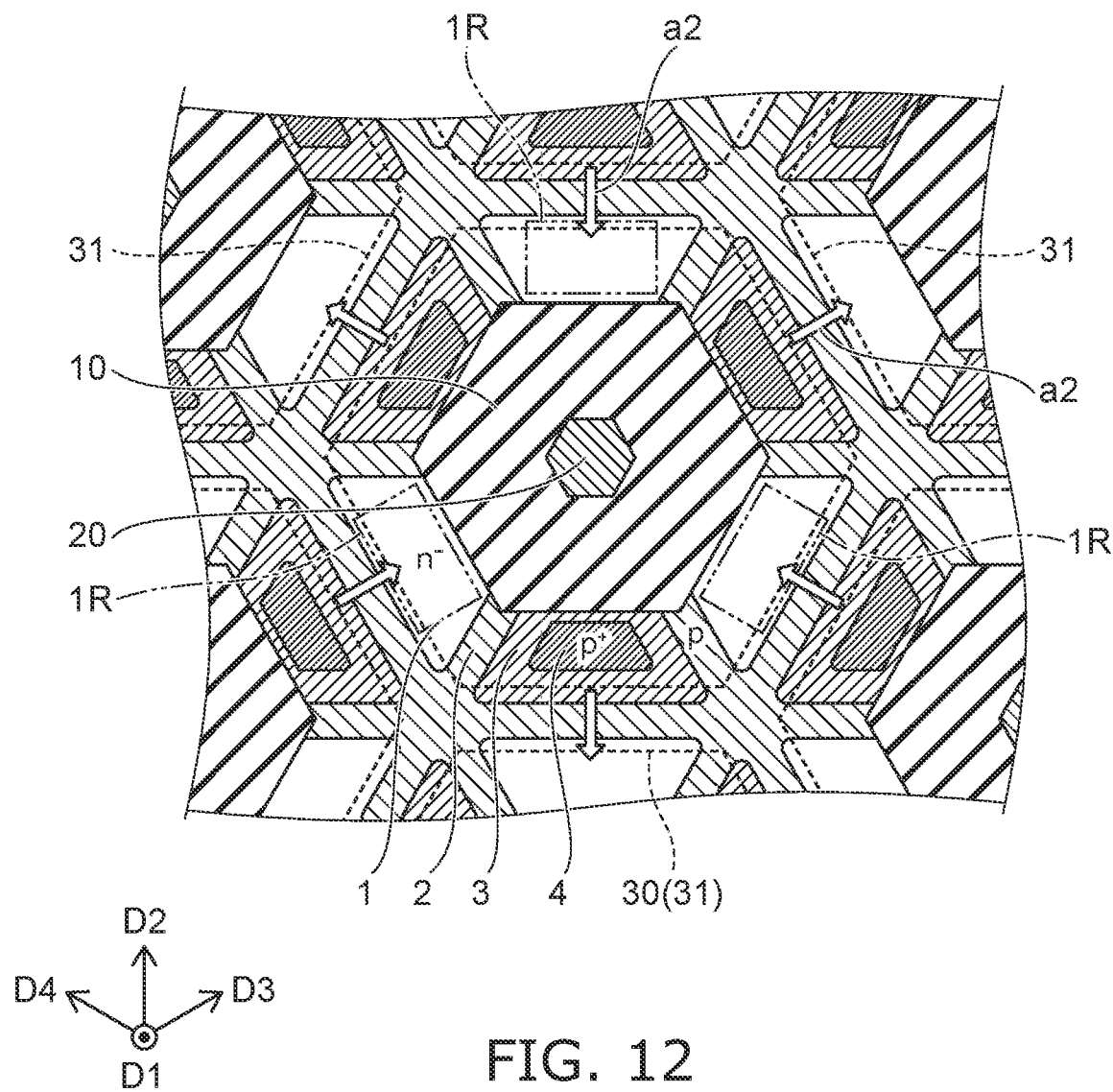
FIG. 12 is a schematic view showing an operation of the semiconductor device according to the first modification of the embodiment.

FIG. 12 is a schematic view showing an operation of the semiconductor device according to the first modification of the embodiment.

FIG. 12 shows the semiconductor device 110 in the on-state. In the semiconductor device 110, the p-type base region 2 is located between the conductive parts 20 that are next to each other in each of the directions D2 to D4. Therefore, in the on-state as shown by arrows a2, electrons flow from the p-type base region 2 toward the first region 1R along each of the directions D2 to D4. According to the first modification, compared to the semiconductor device 100, the surface area of the channel formed per unit area (the channel density) can be increased, and the on-resistance of the semiconductor device 110 can be reduced.

Second Modification

Figure 13:
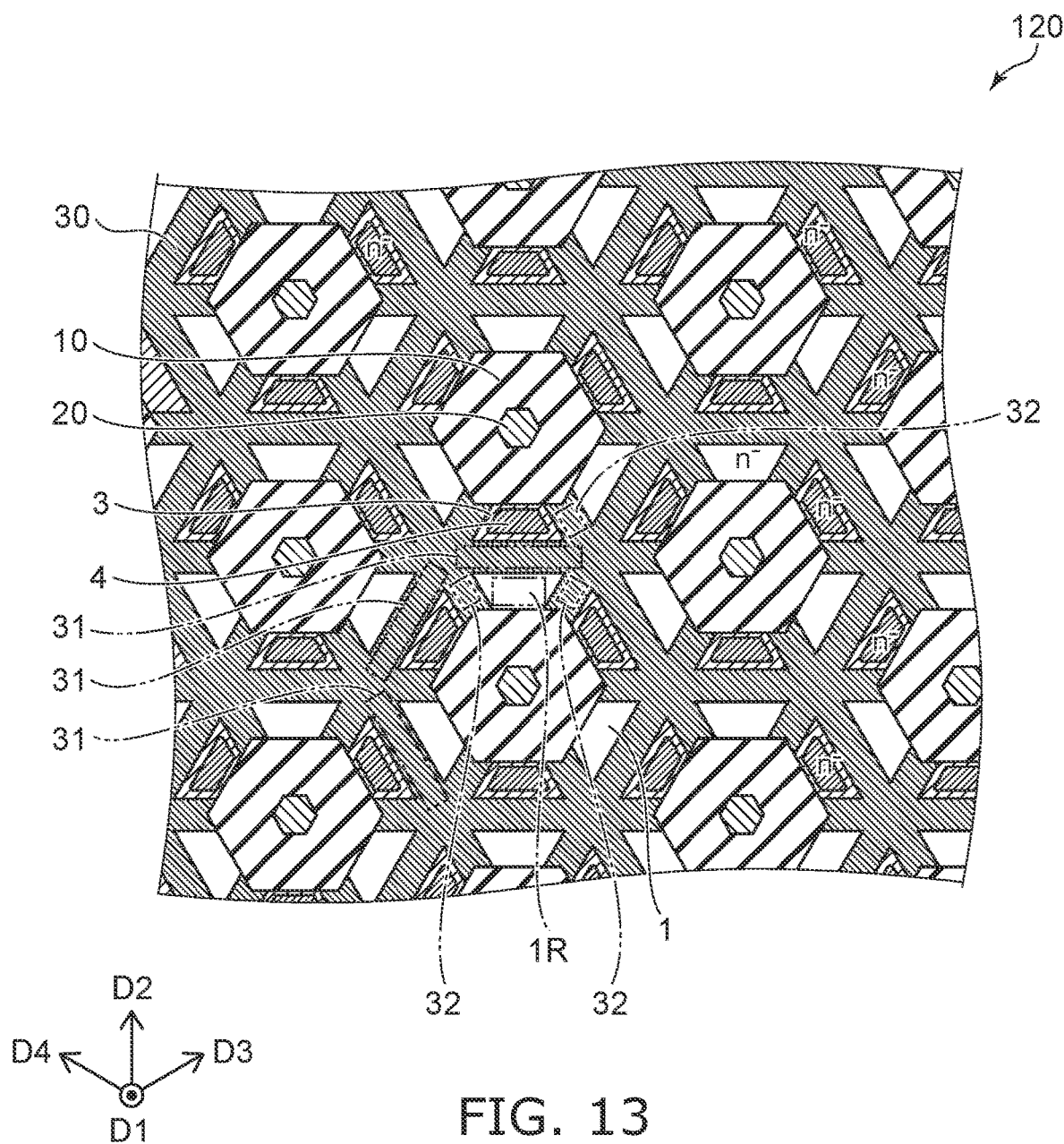
FIG. 13 is a plan view showing a portion of a semiconductor device according to a second modification of the embodiment.
Figure 14:
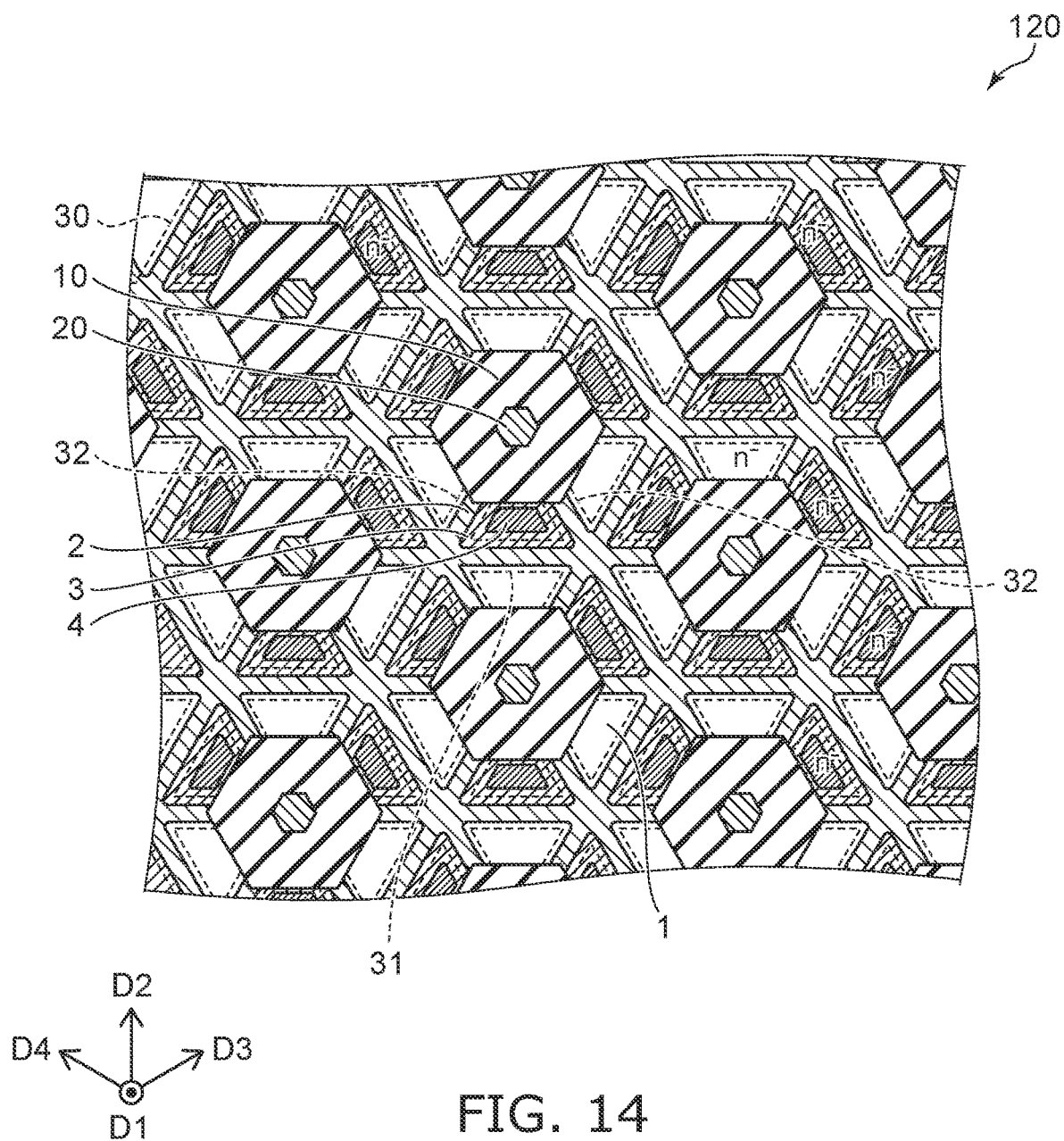
FIG. 14 is a plan view showing a portion of the semiconductor device according to the second modification of the embodiment.

FIGS. 13 and 14 are plan views showing a portion of a semiconductor device according to a second modification of the embodiment. The insulating layer 36 and the source electrode 50 are not illustrated in FIGS. 13 and 14. The gate electrode 30 is shown by a broken line in FIG. 14.

In the semiconductor device 120 according to the second modification as shown in FIG. 13, compared to the semiconductor device 110, the gate electrode 30 further includes a second electrode portion 32. The second electrode portion 32 is connected with one extension-direction end of the first electrode portion 31. The second electrode portion 32 extends from the one end of the first electrode portion 31 toward the conductive part 20 when viewed along the direction D1. The first electrode portion 31 is positioned on a portion of the p-type base region 2, a portion of the $n^+$-type source region 3, and a portion of the first region 1R with the gate insulating layer 35 interposed. The second electrode portion 32 is positioned on another portion of the p-type base region 2, another portion of the $n^+$-type source region 3, and another portion of the first region 1R with the gate insulating layer 35 interposed.

Figure 15:
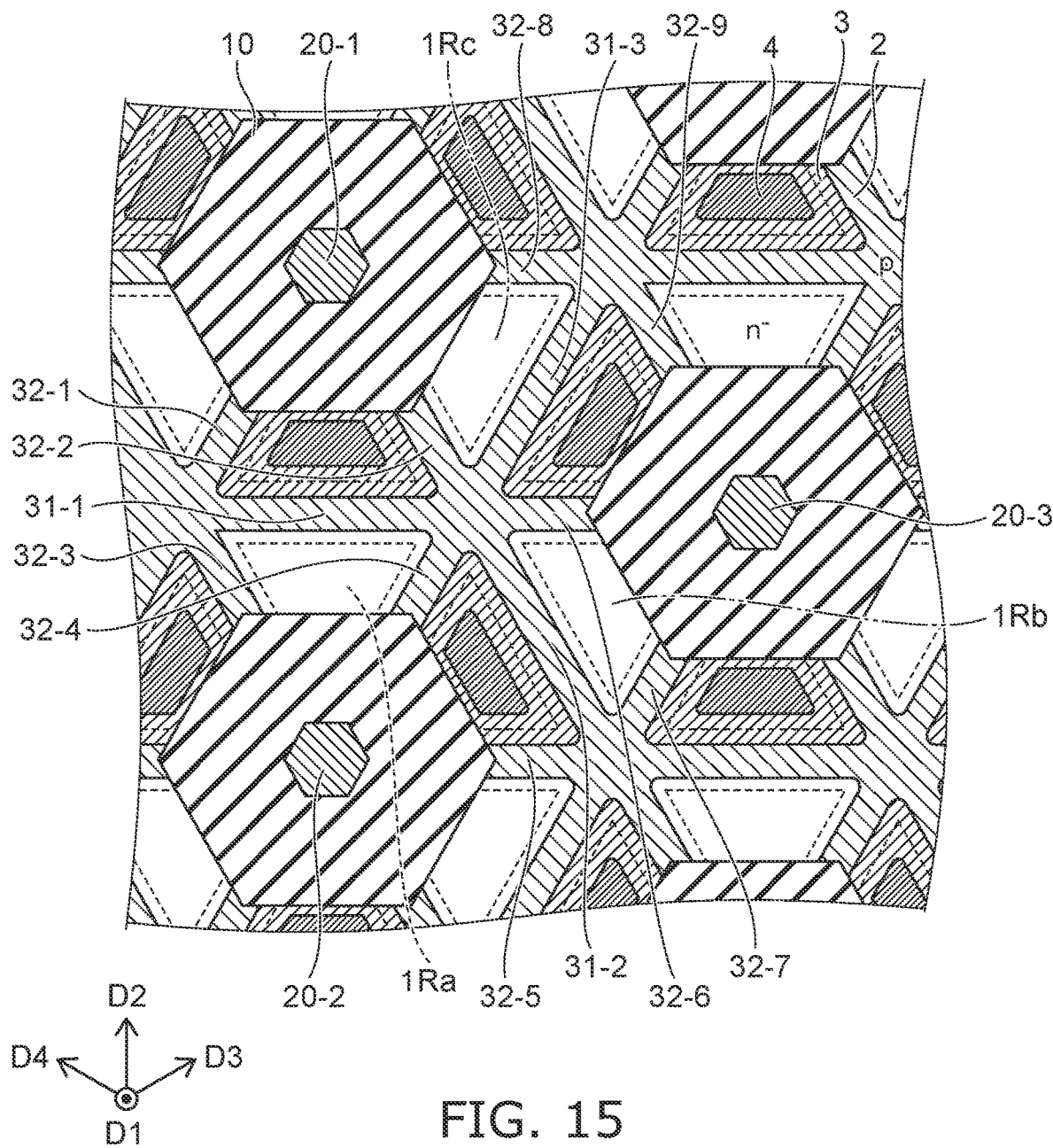
FIG. 15 is an enlarged plan view of a portion of FIG. 14.

FIG. 15 is an enlarged plan view of a portion of FIG. 14.

As a specific example, the multiple conductive parts 20 include conductive parts 20-1 to 20-3 as shown in FIG. 14. The multiple first electrode portions 31 include first electrode portions 31-1 to 31-3. The multiple second electrode portions 32 include second electrode portions 32-1 to 32-9. The multiple first regions 1R include first regions 1Ra to 1Rc.

The conductive part 20-1 and the conductive part 20-2 are next to each other in the direction D2. The position in the direction D2 of the first electrode portion 31-1 is between the position in the direction D2 of the conductive part 20-1 and the position in the direction D2 of the conductive part 20-2. The first electrode portion 31-1 extends in an extension direction crossing the direction connecting the conductive parts 20-1 and 20-2. The second electrode portions 32-1 to 32-4 are connected to the two extension-direction ends of the first electrode portion 31-1. The positions in the direction D2 of the second electrode portions 32-1 and 32-2 are between the position in the direction D2 of the first electrode portion 31-1 and the position in the direction D2 of the conductive part 20-1. The positions in the direction D2 of the second electrode portions 32-3 and 32-4 are between the position in the direction D2 of the first electrode portion 31-1 and the position in the direction D2 of the conductive part 20-2. The position in the direction D2 of the first region 1Ra is between the position in the direction D2 of the first electrode portion 31-1 and the position in the direction D2 of the conductive part 20-2.

Similarly, the conductive part 20-2 and the conductive part 20-3 are next to each other in the direction D3. The position in the direction D3 of the first electrode portion 31-2 is between the position in the direction D3 of the conductive part 20-2 and the position in the direction D3 of the conductive part 20-3. The first electrode portion 31-2 extends in an extension direction crossing the direction connecting the conductive parts 20-2 and 20-3. The second electrode portions 32-4 to 32-7 are connected to the two extension-direction ends of the first electrode portion 31-2. The position in the direction D3 of the first region 1Rb is between the position in the direction D3 of the first electrode portion 31-2 and the position in the direction D2 of the conductive part 20-3. The conductive part 20-1 and the conductive part 20-3 are next to each other in the direction D4. The position in the direction D4 of the first electrode portion 31-3 is between the position in the direction D4 of the conductive part 20-1 and the position in the direction D4 of the conductive part 20-3. The first electrode portion 31-3 extends in an extension direction crossing the direction connecting the conductive parts 20-1 and 20-3. The second electrode portions 32-2, 32-6, 32-8, and 32-9 are connected to the two extension-direction ends of the first electrode portion 31-3. The position in the direction D4 of the first region 1Rc is between the position in the direction D4 of the first electrode portion 31-3 and the position in the direction D4 of the conductive part 20-1.

Figure 16:
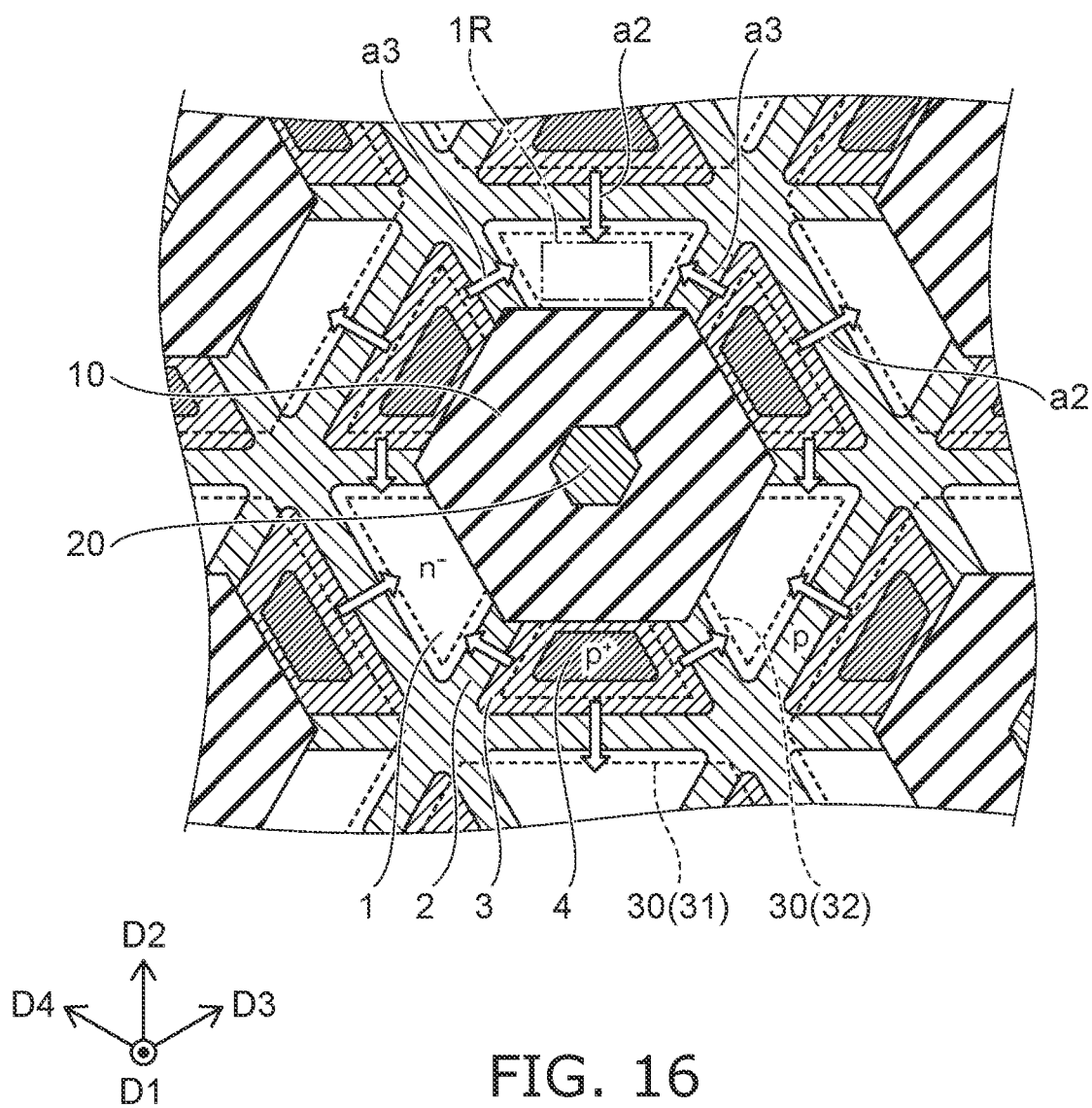
FIG. 16 is a schematic view showing an operation of the semiconductor device according to the second modification of the embodiment.

FIG. 16 is a schematic view showing an operation of the semiconductor device according to the second modification of the embodiment.

FIG. 16 shows the semiconductor device 120 in the on-state. A channel is formed in the p-type base region 2 by the first and second electrode portions 31 and 32 when the semiconductor device 120 is in the on-state. In the on-state as shown by arrows a3, electrons flow from the p-type base region 2 toward the first region 1R via the channel formed by the second electrode portion 32. According to the second modification, compared to the semiconductor device 110, the channel density can be further increased, and the on-resistance of the semiconductor device 120 can be further reduced.

According to the first modification, compared to the semiconductor device 120, the surface area of the p$^+$-type contact region 4 can be increased because the second electrode portion 32 is not included. A large amount of carriers is generated when avalanche breakdown occurs in the semiconductor device. Holes are discharged to the source electrode 50 via the p-type base region 2 and the p$^+$-type contact region 4. When the surface area of the p$^+$-type contact region 4 is increased, the electrical resistance to the holes can be reduced. For example, the fluctuation of the potential of the p-type base region 2 can be suppressed, and the operation of a parasitic transistor made of the n$^-$-type drift region 1, the p-type base region 2, and the n$^+$-type source region 3 can be suppressed. Therefore, according to the first modification, compared to the semiconductor device 120, the avalanche resistance of the semiconductor device 110 can be improved.

Third Modification

Figure 17:
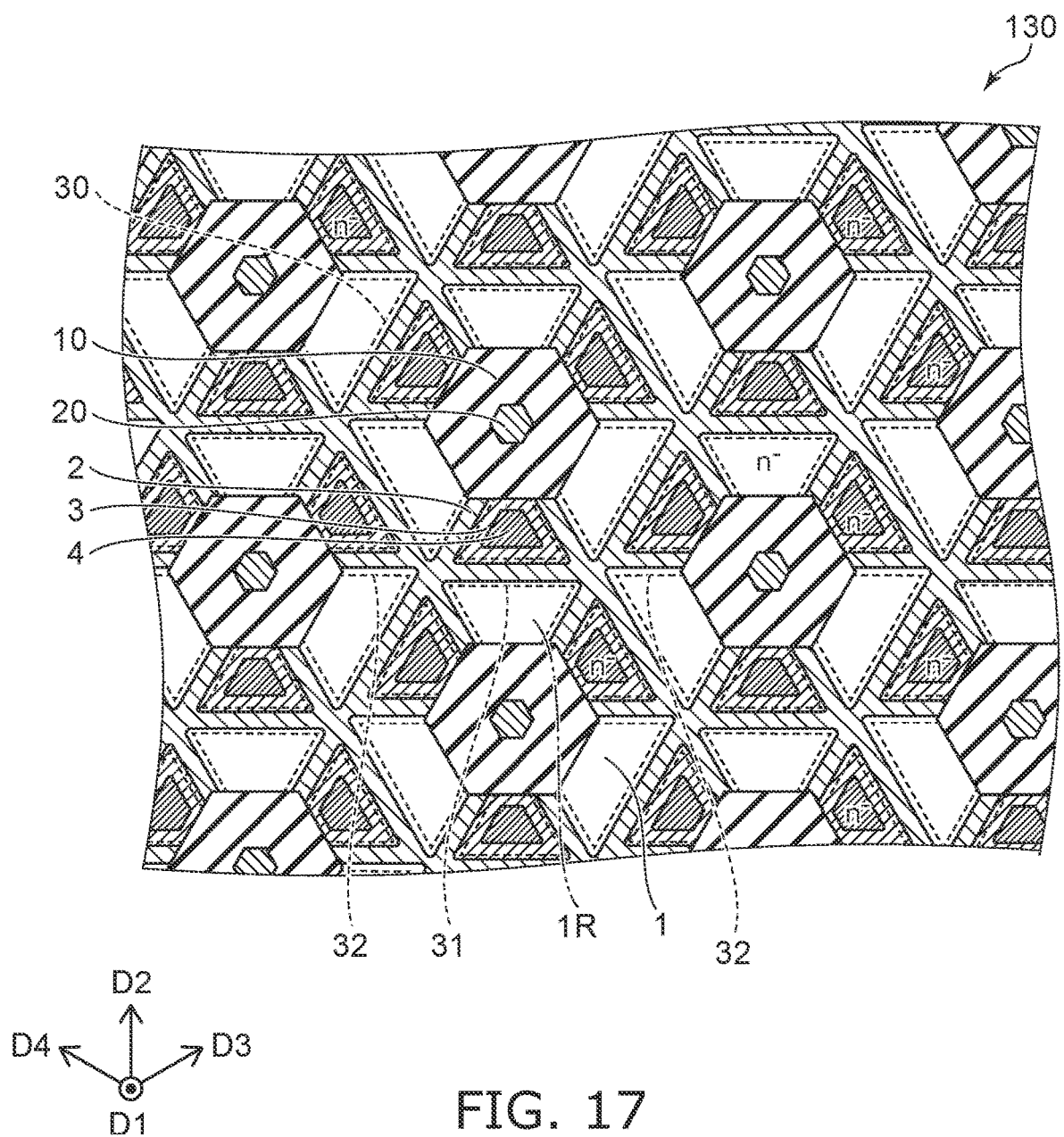
FIG. 17 is a plan view showing a portion of a semiconductor device according to a third modification of the embodiment.

FIG. 17 is a plan view showing a portion of a semiconductor device according to a third modification of the embodiment. In FIG. 17, the insulating layer 36 and the source electrode 50 are not illustrated, and the gate electrode 30 is shown by a broken line.

In the examples shown in FIGS. 11 to 16, the multiple first electrode portions 31 are arranged in a regular hexagonal shape. Also, one first electrode portion 31 and a pair of second electrode portions 32 are arranged in the extension direction of the first electrode portion 31. The positional relationship between the first electrode portions 31 and the positional relationship between the first electrode portion 31 and the second electrode portion 32 are not limited to the examples shown in these drawings. For example, as in the semiconductor device 130 according to the third modification shown in FIG. 17, the end portions of the first electrode portion 31 extending in the directions D2 to D4 may be shifted from each other. One first electrode portion 31 and a pair of second electrode portions 32 may be slightly shifted in the extension direction of the first electrode portion 31. As long as the current can flow along at least two of the directions D2 to D4 as shown in FIG. 17, the specific shape of the gate electrode 30 is modifiable as appropriate.

Fourth Modification

Figure 18:
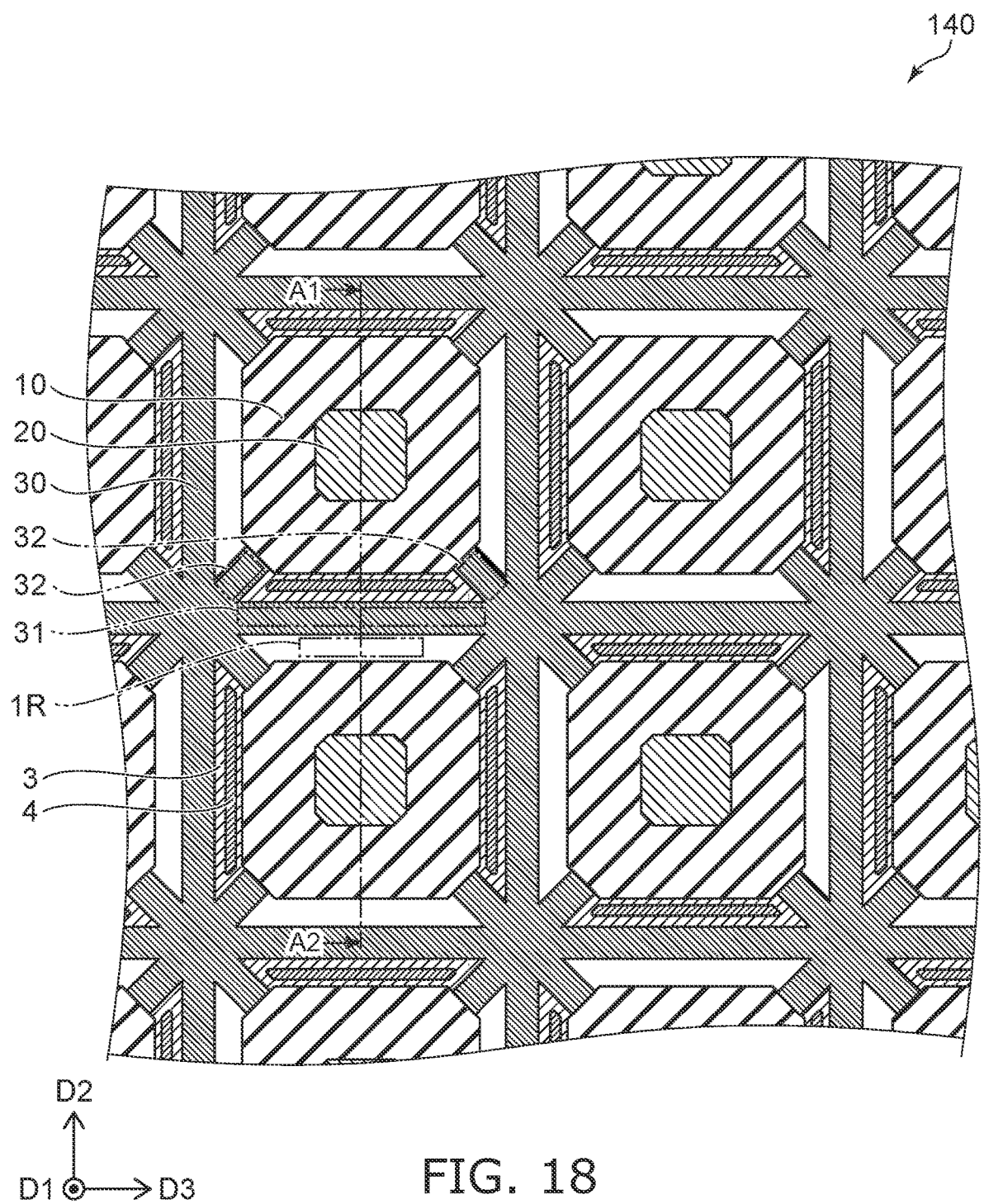
FIG. 18 is a plan view showing a portion of a semiconductor device according to a fourth modification of the embodiment.
Figure 19:
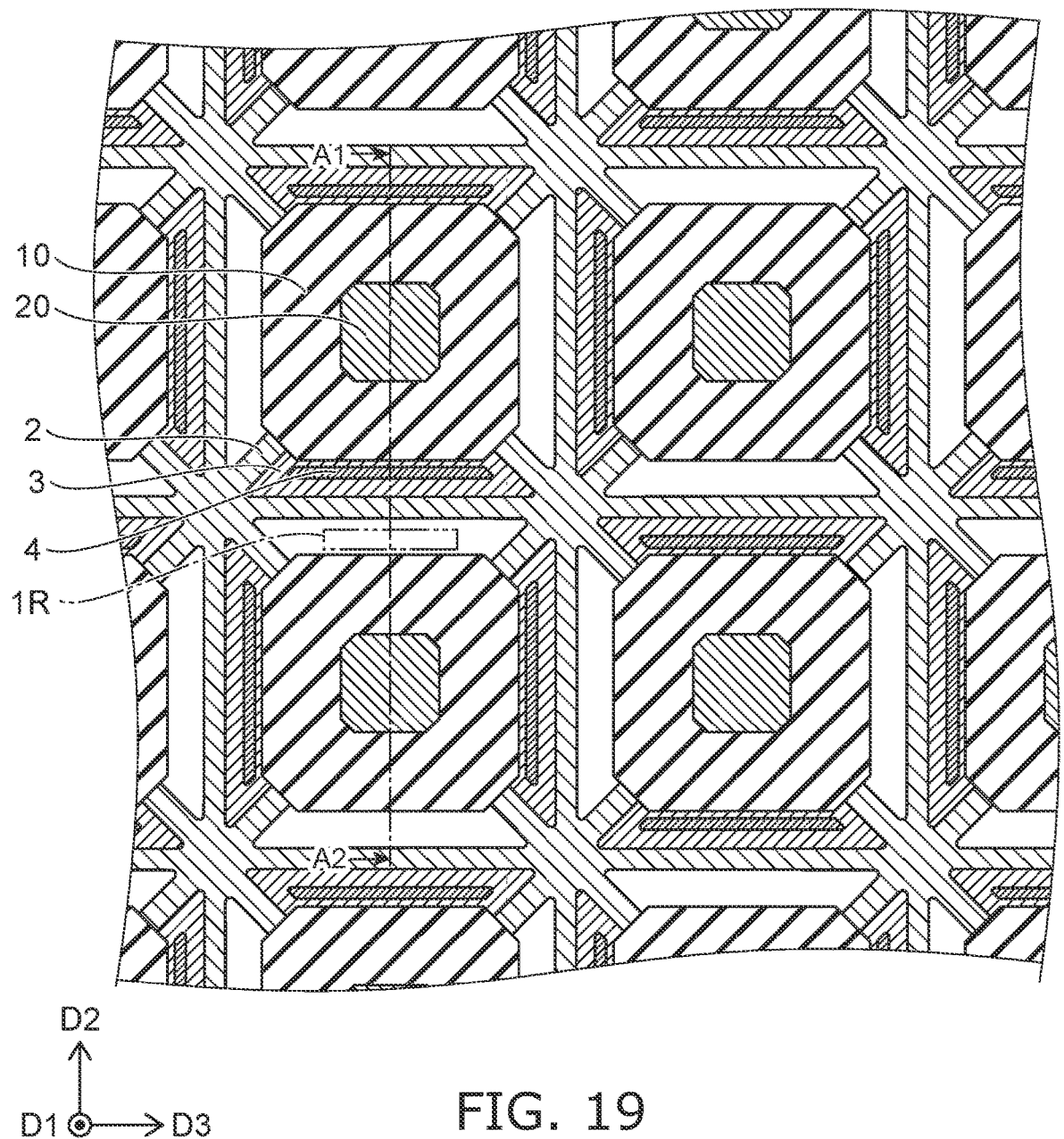
FIG. 19 is a plan view showing a portion of the semiconductor device according to the fourth modification of the embodiment.
Figure 20:
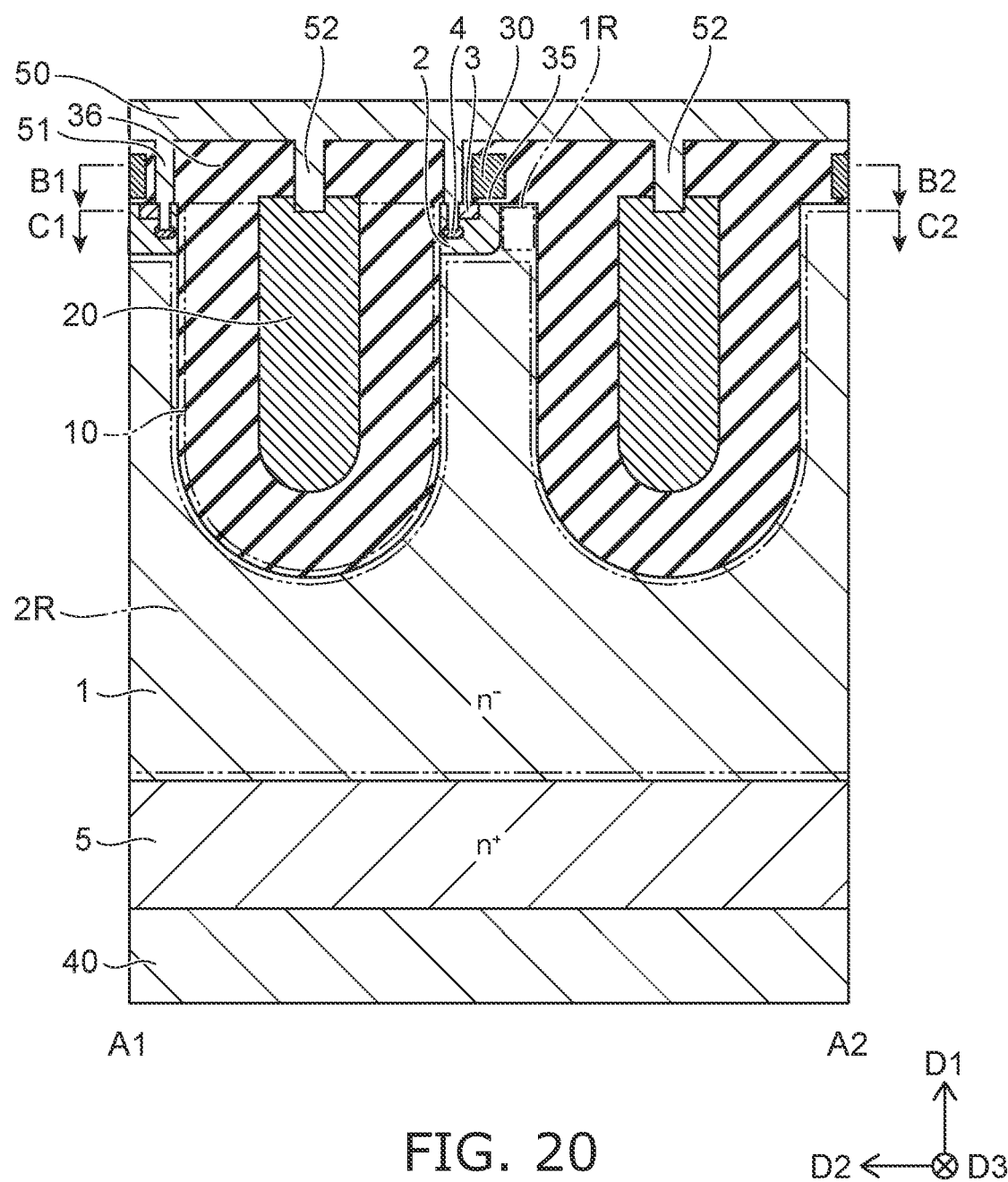
FIG. 20 is an A1-A2 cross-sectional view of FIGS. 18 and 19.

FIGS. 18 and 19 are plan views showing a portion of a semiconductor device according to a fourth modification of the embodiment. FIG. 20 is an A1-A2 cross-sectional view of FIGS. 18 and 19. FIG. 18 corresponds to a B1-B2 cross-sectional view of FIG. 20. FIG. 19 corresponds to a C1-C2 cross-sectional view of FIG. 20. The insulating layer 36 and the source electrode 50 are not illustrated in FIGS. 18 and 19. In FIG. 19, the gate electrode 30 also is not illustrated.

In the semiconductor device 140 according to the fourth modification as shown in FIGS. 18 and 19, the directions D2 and D3 that are the arrangement directions of the conductive parts 20 are orthogonal to each other. In the semiconductor device 140, compared to the semiconductor devices 100 to 130, the shapes in the X-Y plane of the p-type base region 2, the n$^+$-type source region 3, the insulating part 10, the gate electrode 30, etc., are different. The multiple first electrode portions 31 of the gate electrode 30 are arranged in a lattice shape.

Other than the arrangement directions and shapes, the positional relationships of the components of the semiconductor device 140 are substantially the same as those of the semiconductor devices 100 to 130. For example, as shown in FIGS. 18 to 20, the p-type base region 2, the n$^+$-type source region 3, and the first region 1R are located between the conductive parts 20 that are next to each other; and the first electrode portion 31 is positioned on these regions. The first electrode portion 31 extends along the direction D2 or D3; and the second electrode portion 32 extends from one end of the first electrode portion 31 toward the conductive part 20. The p-type base region 2 and the first region 1R are alternately arranged around one conductive part 20 in the X-Y plane.

Figure 21:
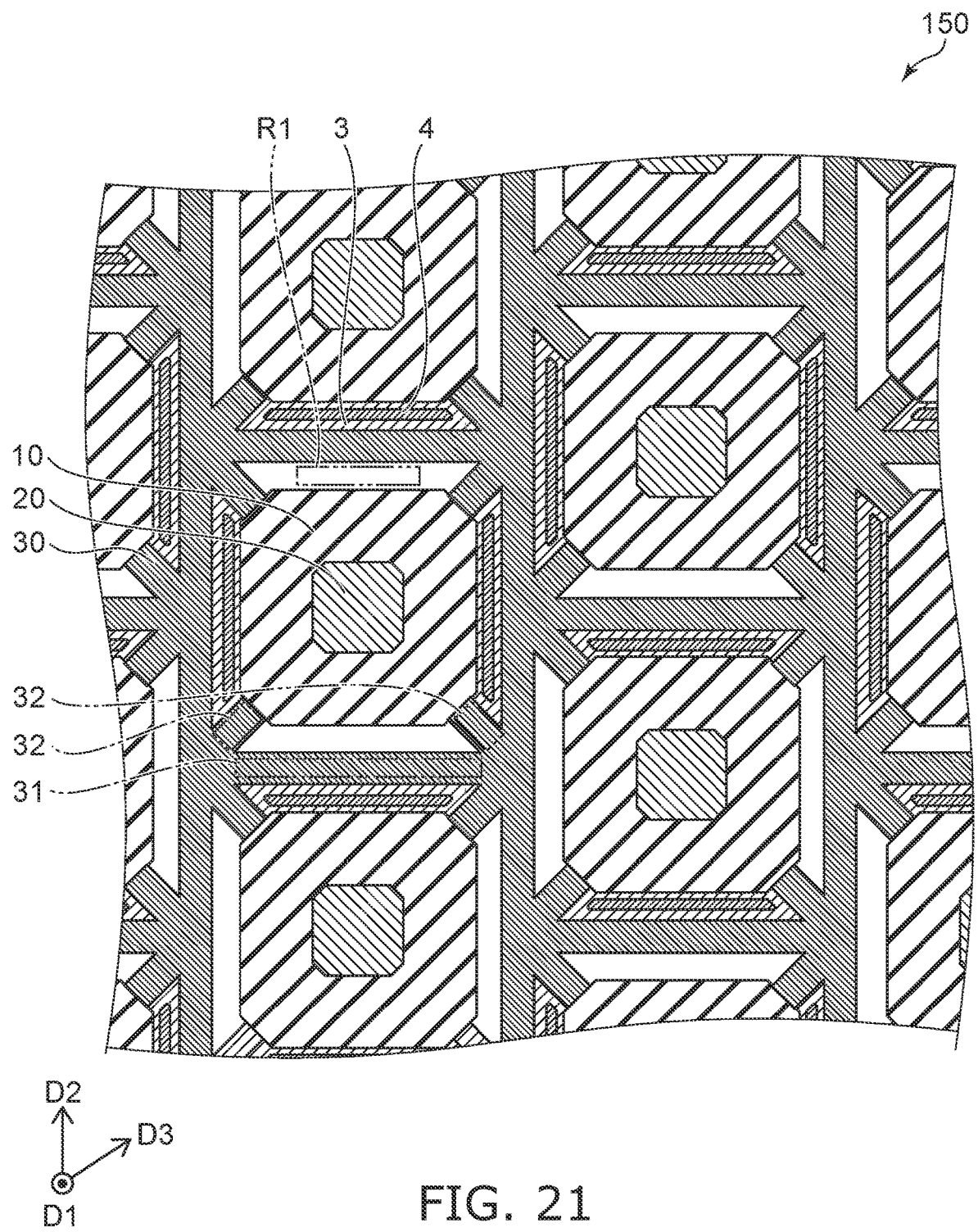
FIG. 21 is a plan view showing a portion of another semiconductor device according to the fourth modification of the embodiment.

FIG. 21 is a plan view showing a portion of another semiconductor device according to the fourth modification of the embodiment. The insulating layer 36 and the source electrode 50 are not illustrated in FIG. 21.

In a semiconductor device that includes a rectangular insulating part 10, lattice-shaped multiple first electrode portions 31, etc., the direction D3 may not be perpendicular to the direction D2 as shown in FIG. 21. In the semiconductor device 150 shown in FIG. 21, the positions in the direction D2 of the conductive parts 20 that are next to each other in the direction D3 are different from each other. The positions in the direction D2 of the first electrode portions 31 that are next to each other in the direction D3 are different from each other.

As shown in FIGS. 18 to 21, the specific shapes, arrangement directions, etc., of the components of the semiconductor device are modifiable as appropriate. In each embodiment, the on-resistance of the semiconductor device can be reduced while suppressing the increase of the capacitance Cgd or the increase of the number of manufacturing processes by arranging the multiple conductive parts 20 in two directions that cross each other and by providing the gate electrode 30 on the p-type base region 2.

In the embodiments described above, the relative levels of the impurity concentrations between the semiconductor regions can be confirmed using, for example, a scanning capacitance microscope (SCM). The carrier concentration in each semiconductor region can be considered to be equal to the activated impurity concentration in each semiconductor region. Accordingly, the relative levels of the carrier concentrations between the semiconductor regions also can be confirmed using SCM. The impurity concentration in each semiconductor region can be measured by, for example, secondary ion mass spectrometry (SIMS).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. The above embodiments can be practiced in combination with each other.

What is claimed is:

1. A semiconductor device, comprising:
    a first electrode;
    a first semiconductor region located on the first electrode and electrically connected with the first electrode, the first semiconductor region being of a first conductivity type;
    a plurality of conductive parts located in the first semiconductor region with insulating parts interposed, the plurality of conductive parts being arranged in a second direction and a third direction, the second direction being perpendicular to a first direction, the first direction being from the first electrode toward the first semiconductor region, the third direction being perpendicular to the first direction and crossing the second direction;
    a second semiconductor region located on a portion of the first semiconductor region, the second semiconductor region being of a second conductivity type;
    a third semiconductor region located on a portion of the second semiconductor region, the third semiconductor region being of the first conductivity type;
    a gate electrode located on the second semiconductor region with a gate insulating layer interposed; and
    a second electrode located on the second semiconductor region, the third semiconductor region, and the gate electrode and electrically connected with the second semiconductor region, the third semiconductor region, and the plurality of conductive parts.

2. The device according to claim 1, wherein
a plurality of the second semiconductor regions and a plurality of the third semiconductor regions are arranged around one of the plurality of conductive parts in a first plane perpendicular to the first direction.

3. The device according to claim 2, wherein
the first semiconductor region includes a first region arranged with the second semiconductor region in the first plane, and
the first region and the second semiconductor region are alternately arranged around the one of the plurality of conductive parts.

4. The device according to claim 1, wherein
the plurality of conductive parts includes a pair of the conductive parts next to each other in the second direction,
the gate electrode includes a first electrode portion, and
a position in the second direction of the first electrode portion is between a position in the second direction of one of the pair of conductive parts and a position in the second direction of the other of the pair of conductive parts.

5. The device according to claim 4, wherein
the first electrode portion extends in an extension direction crossing a direction connecting the pair of conductive parts,
the gate electrode further includes a second electrode portion connected with one end of the first electrode portion in the extension direction, and
a position in the second direction of the second electrode portion is between the position of the one of the pair of conductive parts and the position of the first electrode portion.

6. The device according to claim 5, wherein
the first electrode portion and the second electrode portion are positioned on the second semiconductor region with the gate insulating layer interposed.

7. The device according to claim 5, wherein
the second electrode includes a first extension portion extending in the first direction through a region of a first plane perpendicular to the first direction,
the region is surrounded with the first electrode portion and a plurality of the second electrode portions, and
the first extension portion contacts the third semiconductor region.

8. The device according to claim 1, wherein
the first semiconductor region includes:
    a first region arranged with the second semiconductor region in a first plane perpendicular to the first direction; and
    a second region positioned lower than the second semiconductor region, and
a first-conductivity-type impurity concentration of the first region is greater than a first-conductivity-type impurity concentration of the second region.

* * * * *